United States Patent
Doaré et al.

(10) Patent No.: US 12,228,670 B2
(45) Date of Patent: Feb. 18, 2025

(54) COMMUNICATION UNIT, INTEGRATED CIRCUITS AND METHOD FOR CLOCK AND DATA SYNCHRONIZATION

(71) Applicant: NXP USA, Inc., Austin, TX (US)

(72) Inventors: Olivier Doaré, La Salvetat St Gilles (FR); Didier Salle, Toulouse (FR); Cristian Pavao Moreira, Frouzins (FR); Julien Orlando, Toulouse (FR); Jean-Stephane Vigier, Mondonville (FR); Andres Barrilado Gonzalez, Toulouse (FR)

(73) Assignee: NXP USA, Inc., Austin, TX (US)

( * ) Notice: Subject to any disclaimer, the term of this patent is extended or adjusted under 35 U.S.C. 154(b) by 738 days.

(21) Appl. No.: 16/447,985

(22) Filed: Jun. 21, 2019

(65) Prior Publication Data

US 2020/0003862 A1 Jan. 2, 2020

(30) Foreign Application Priority Data

Jul. 2, 2018 (EP) .................................. 18305860

(51) Int. Cl.
*G01S 7/00* (2006.01)
*G01S 7/35* (2006.01)
(Continued)

(52) U.S. Cl.
CPC ............... *G01S 7/003* (2013.01); *G06F 1/10* (2013.01); *G06F 1/12* (2013.01); *H03L 7/08* (2013.01); *H03M 1/1245* (2013.01); *G01S 7/35* (2013.01)

(58) Field of Classification Search
CPC ..... G06F 1/10; G06F 1/12; G06F 1/08; G01S 7/003; G01S 7/35; G01S 7/352;
(Continued)

(56) References Cited

U.S. PATENT DOCUMENTS 3,889,236 A 6/1975 Herger et al.
6,209,072 B1 3/2001 MacWilliams et al.
(Continued)

FOREIGN PATENT DOCUMENTS

WO 0070460 A1 11/2000

OTHER PUBLICATIONS

Syllaios, I. L. et al. "DPLL with Hybrid Phase/Frequency Detector", IEEE International Symposium on Circuits and Systems, pp. 2569-2572 (May 2015).
(Continued)

*Primary Examiner* — Lincoln D Donovan
*Assistant Examiner* — Tyler J Pereny

(57) ABSTRACT

A communication unit includes a plurality of cascaded devices that include at least one master device and at least one slave device configured in a master-slave arrangement. The at least one master device and at least one slave device each include: a demodulator circuit configured to receive a distributed reference clock signal and re-create a system clock signal therefrom; a clock generation circuit that includes an internally-generated reference phase locked loop configured to receive the re-created system clock signal to create a master-slave clock signal; and an analog-to-digital converter, ADC, coupled to the reference phase locked loop and configured to use a same master-slave clock signal to align respective sampling instants between each ADC of the at least one master device and at least one slave device.

18 Claims, 9 Drawing Sheets

(51) Int. Cl.
*G06F 1/10* (2006.01)
*G06F 1/12* (2006.01)
*H03L 7/08* (2006.01)
*H03M 1/12* (2006.01)

(58) Field of Classification Search
CPC ...... G01S 13/931; G01S 13/87; G01S 13/878;
G01S 13/343; G01S 7/032; G01S 13/34;
H03L 7/08; H03L 7/00; H03L 7/07;
H03M 1/1245; H04L 7/065; H04L 7/033;
H04L 27/0008; H04L 7/0087; H04L
7/0091; H04L 7/0008; H04L 7/0331;
H04L 7/0012; H04L 7/04; H04J 3/0685;
H04J 3/0667; H04J 3/0644; H04J 3/0658;
H04J 3/0638
See application file for complete search history.

(56) References Cited

U.S. PATENT DOCUMENTS

| | | | |
|---|---|---|---|
| 6,232,806 B1 | 5/2001 | Woeste et al. | |
| 6,775,328 B1 | 8/2004 | Segaram | |
| 6,963,219 B1 | 11/2005 | Ghia et al. | |
| 7,375,563 B1* | 5/2008 | Cheung | H03L 7/18 327/147 |
| 7,443,201 B2 | 10/2008 | Koo | |
| 7,646,220 B2 | 1/2010 | Wu | |
| 7,876,261 B1 | 1/2011 | Adams | |
| 8,121,200 B2 | 2/2012 | Zheng | |
| 8,416,005 B2 | 4/2013 | Luo et al. | |
| 8,654,166 B2 | 2/2014 | Kamatani | |
| 9,031,180 B2 | 5/2015 | Rahul et al. | |
| 9,094,908 B1* | 7/2015 | Shor | H04J 3/0685 |
| 9,279,883 B2 | 3/2016 | Ygnace et al. | |
| 9,292,036 B2 | 3/2016 | Grocutt et al. | |
| 9,547,071 B2 | 1/2017 | Vaucher et al. | |
| 9,564,913 B1 | 2/2017 | Courcy | |
| 9,698,735 B1 | 7/2017 | McCue et al. | |
| 9,727,767 B2 | 8/2017 | Breitfuss et al. | |
| 10,615,958 B2 | 4/2020 | Vigier et al. | |
| 10,644,872 B2 | 5/2020 | Pavao Moreira et al. | |
| 11,054,513 B2 | 7/2021 | Doaré et al. | |
| 2003/0189458 A1 | 10/2003 | Nagano et al. | |
| 2004/0190666 A1 | 9/2004 | Aiello et al. | |
| 2004/0196926 A1 | 10/2004 | Chien et al. | |
| 2005/0018762 A1* | 1/2005 | Aiello | H04L 1/0003 375/219 |
| 2005/0237966 A1 | 10/2005 | Aiello et al. | |
| 2006/0056563 A1 | 3/2006 | Aweya et al. | |
| 2008/0123792 A1 | 5/2008 | Prete et al. | |
| 2009/0322335 A1 | 12/2009 | Adachi et al. | |
| 2010/0023792 A1 | 1/2010 | Tsuji | |
| 2010/0090876 A1 | 4/2010 | Taft et al. | |
| 2011/0109360 A1 | 5/2011 | Dennis et al. | |
| 2011/0311008 A1 | 12/2011 | Slezak et al. | |
| 2014/0173391 A1* | 6/2014 | Hahn | H04L 25/45 327/202 |
| 2015/0153445 A1 | 6/2015 | Jansen | |
| 2017/0023663 A1* | 1/2017 | Subburaj | G01S 7/032 |
| 2017/0315211 A1 | 11/2017 | Subburaj et al. | |
| 2017/0366175 A1 | 12/2017 | Feldtkeller | |
| 2018/0024233 A1 | 1/2018 | Searcy et al. | |
| 2018/0115409 A1* | 4/2018 | Nayyar | G01S 7/02 |
| 2018/0175831 A1 | 6/2018 | Reuter | |
| 2018/0210067 A1 | 7/2018 | Bilik et al. | |
| 2018/0262321 A1 | 9/2018 | Yan et al. | |
| 2018/0348342 A1 | 12/2018 | Ginsburg | |
| 2019/0273502 A1 | 9/2019 | Khalid et al. | |
| 2020/0003882 A1 | 1/2020 | Salle et al. | |

OTHER PUBLICATIONS

Siriburanon, T. et al. "A 2.2 GHz-242 dB-FOM 4.2 mW ADC-PLL Using Digital Sub-Sampling Architecture", IEEE Journal of Solid-State Circuits, vol. 51, No. 6, pp. 1385-1397 (Jun. 2016).
EP Patent Appln. No. 18305861.9, 40 pgs., (Jul. 2, 2018).
EP Patent Appln. No. 18305858.5, 38 pgs., (Jul. 2, 2018).
EP Patent Appln. No. 18305857.7, 39 pgs., (Jul. 2, 2018).
EP Patent Appln. No. 18305856.9, 26 pgs., (Jul. 2, 2018).
U.S. Appl. No. 16/447,908 NOA dated Mar. 22, 2022, 9 pages.
U.S. Appl. No. 16/447,908 NFOA dated Oct. 26, 2020, 17 pages.
Guo, X. et al. "A Receiver with Start-up Initalization and Programmable Delays for Wireless Clock Distribution", IEEE International Solid State Circuits Conference—Digest of Technical Papers, pp. 1530-1539 (2006).
Maxim, "10-Bit Bus LVDS Deserializers", Jan. 1, 2010, retrieved from the internet at https://datasheets.maximintegrated.com/en/ds/MAX9206-MAX9208.pdf on Jun. 18, 2019, 12 pages.
Non-Final Rejection for U.S. Appl. No. 16/447,962, 17 pgs. (dated Feb. 26, 2021).
Notice of Allowance for U.S. Appl. No. 16/447,962, 8 pgs. (dated Jun. 2, 2021).
Otto, T. "Principles and Applications of FMCW Radars", TUDelft—Delft University of Technology, 21 pgs., retrieved from the internet at: http://www.raingain.eu/sites/default/files/x_vs_c_band_raingain_leuven_apr_2012.pdf (2012).
U.S. Appl. No. 16/447,947 Notice of Allowance dated Jan. 21, 2021, 7 pages.
U.S. Appl. No. 16/447,979 Notice of Allowance dated Feb. 3, 2020, 8 pages.
European Search Report for Patent Application No. 18305858.5, dated May 17, 2019, 15 pgs.

* cited by examiner

FIG. 1 – Prior Art

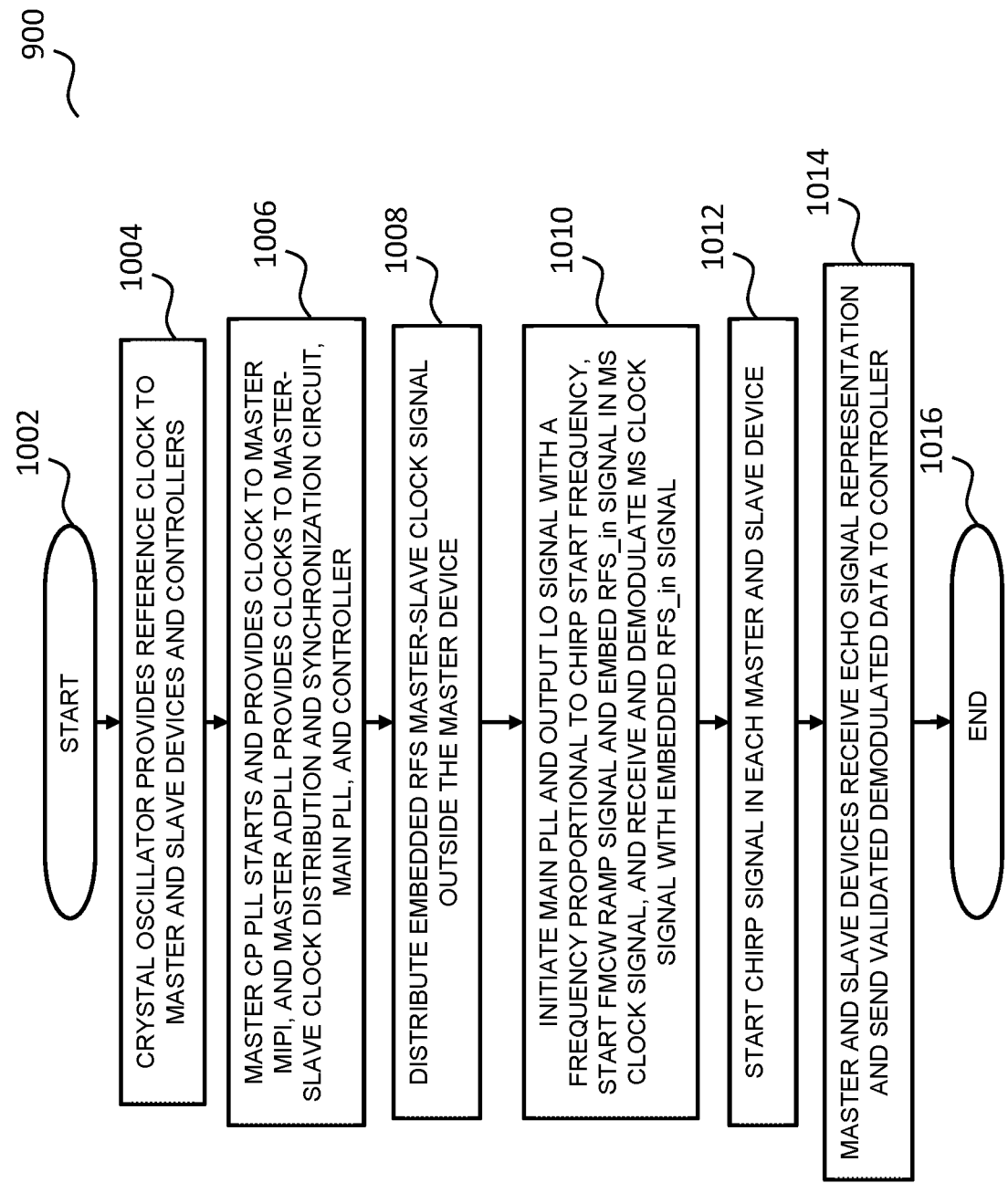

COMMUNICATION UNIT, INTEGRATED CIRCUITS AND METHOD FOR CLOCK AND DATA SYNCHRONIZATION

CROSS-REFERENCE TO RELATED APPLICATIONS

This application claims the priority under 35 U.S.C. § 119 of European Patent application no. Application No. 18305860.1, filed on Jul. 2, 2018, the contents of which are incorporated by reference herein.

FIELD OF THE INVENTION

The field of the invention relates to a communication unit, such as a radar unit, that includes a distributed master-slave arrangement and methods for clock and data synchronization. The invention is applicable to, but not limited to, a radar unit for, say, an automotive application, and method therefor.

BACKGROUND OF THE INVENTION

There has been an increased demand for active safety systems for vehicles. Active safety systems require multiple radar sensors per vehicle, each radar sensor typically working with a specific radar technology. In an automotive application, the radar sensors are mostly built using a number of integrated circuits (ICs), sometimes referred to as 'chips'. The current trend is towards offering a radar system on chip (SoC), using a radio frequency (RF) complementary metal-oxide-semiconductor (CMOS) process technology) solution in order to reduce cost and power consumption.

Frequency-modulated continuous wave (FMCW) radar sensors transmit frequency modulated signals, and radar receivers substantially simultaneously receive their echo. The received echo is then mixed with the transmitted signal and results in a low frequency signal having a frequency of:

$$Fb = \frac{2 \times \text{Range}}{c} \times \frac{\text{Modulation } BW}{\text{Ramp duration}} \quad [1]$$

at the output of the mixer, the so-called beat frequency (Fb). By analysing the beat frequency, the range parameter (i.e. a distance to targets) can be extracted.

Commercial automotive radar sensors typically include multiple receivers and transmitters (the combination of which is referred to as transceivers (TRx)). A microcontroller (MCU) performs digital control of the transceiver circuits and digital signal processing of the digitized data (e.g. fast fourier transform (FFT) and digital signal processing) in order to output processed radar data to the MCU of the vehicle.

Next generation high performance radar solutions used for highly automated or fully autonomous driving will need to comply with stringent radar angular resolution requirements in both azimuth and elevation. Angular resolution is directly related to the radar system number of receiver antennas and their location with respect to each other. Current monolithic radar transceiver ICs are typically constrained to contain only a few transceiver channels, as the complexity and cost and heat dissipation problems of integrating more transceiver channels on the same chip increases substantially with the number of ICs that are included.

To allow increased angular resolution in both azimuth and elevation, a multi-chip set solution with a master device and several slaves may be used, as illustrated in FIG. 1. In this illustration, a known radar unit cascades two radar TRx chips. One of the radar TRx chips is defined as the master device 110, which contains a first set of transmitter circuits coupled to transmit antennas 112 and a first set of receiver circuits coupled to receive antennas 114. The master device 110 (or IC) provides a number of signals 130 to one or more slave device(s) 120. In this way, master and several slaves are cascaded coherently to increase the number of transmit and receive channels, thereby enabling an increase in sensor accuracy to improve angle resolution.

Each master device 110 and slave device 120 embeds several receiver and transmitter channels, and a microcontroller unit (MCU) is used to combine all received data from all receivers, as well as to control and program the master device 110 and slaves devices 120. The master device 110 is arranged to distribute the Local Oscillator (LO) signal 140 off-chip through transmission lines on the printed circuit board (PCB) 100 to other radar chips (in this case the one other TRx chip functioning as a slave device 120). The LO signal 140 is used for the different transmitters and receivers, and is typically star-routed (i.e. routed via equal length paths) to each device to guarantee the same delay and exact phase coherence between all devices (which are sometimes separate ICs). The slave device 120 (and further slave device(s) 123) contains a second set of transmitter circuits coupled to transmit antennas 122 and a second set of receiver circuits coupled to receive antennas 124.

The distribution of the LO signal 140 from the master device 110 ensures that the slave device 120 is also able to use the LO signal 140, and thereby ensure that the transmitting signal frequency and the clock frequency of the down mixer of different radar TRx are the same. The LO signal 140 is used by all devices (including the master device 110 wherein the LO signal 140 is routed out of the master device 110 and thereafter back into the master device 110. Typically, in master-slave arrangements, the LO signal 140 is routed with symmetrical PCB lengths in order to ensure that all receivers (encompassing a respective down mixer) in each master device 110 and slave device(s) 120, 123 of the system receive the same LO with same phase. Phase coherence is mandatory for cascaded systems. Other control signals may be synchronized with a lower speed clock, for example an analog-to-digital converter (ADC) clock, which may be used across multiple ICs/devices.

The master device 110 is coupled to the MCU 160, which includes various interfaces, such as a serial-parallel interface (SPI) 162, a general purpose data input-output port 170, a ramp frame start (RFS) circuit 168, as well as a MCU clock interface 164, this clock signal 165 generally provided by the master device 110.

The RFS signal can be either (i) generated and distributed by the MCU 160, through a dedicated pin on both the MCU 160 (RFS_out) and a single pin on master device(s) 110 and slave device(s) 120, 123 (RFS_in) or (ii) generated and distributed by the master device 110, where there is no pin needed for MCU 160 in this case.

In the first known architecture (i), as illustrated in FIG. 1 and which is the predominant architecture used in most current master-slave arrangements, RFS circuit 168 generates a RFS signal 166 that is used to trigger a starting point of modulation timing engines within each master device and slave device. The RFS signal 166 is generated by the MCU 160 and requires at least one dedicated MCU pin. The RFS can also be generated by the master device 110, through a SPI command from MCU 160 via RFS signal 140. In this case, generally two pins are needed in the master device 110 (to support RFSout, RFSin) and one pin in each slave device (RFSin) in order to allow a star distribution that is preferred to ensure a good symmetry of RFS signal. However, even using star connected PCB routing in the first architecture (i), perfect time alignment of frame start inside master device(s) 110 and slave devices 120 is not possible, 123 because the MCU 160 and master device(s) 110 and slave devices 120, 123 are not synchronized, e.g. they are subject to different pad delays, no control on timing generation of RFS from MCU time engine, etc.

In the second known architecture (ii), when the RFS is generated from the master device 110: the signal to start the generation of RFS comes from a SPI command from the MCU 160. Thus, no RFS at the MCU side is needed in this case. The RFS is then generated by the master device 110. The connection from master device 110 to slave devices 120, 123 for routing that RFS signal can be performed in two different ways:

(a) a not star connected manner using a single pin on each master device 110 and slave device(s) 120, 123, so no alignment is possible; and (b) in a star connected manner whereby two pins (RFS_out and RFS_in) are used in the master device 110, and a single pin (RFS_in) used in each in slave device(s) 120, 123. This star routing ensures the symmetry of the RFS signal length in all chips, and thereby achieves a good alignment of chirp start signal (frame start). However, the inventors have recognised that this alignment is not sufficient to ensure the ADC clocks (i.e. the M/S clocks on each master device 110 and slave device(s) 120, 123) and RFS signal are synchronized between each other.

A master-slave (MS) clock signal 142 is generated by the master device and used as a time base for synchronization of the microcontroller time based events with any other master device and all slave devices 123. The connection to the MCU 160 consists of SPI control lines 163 and digital data line signals from all the ICs back to the MCU 160 for later signal processing, in a given data format (e.g. Mobile Industry Processor Interface Camera Serial Interface (MIPI CSI-2), low voltage differential signalling (LVDS) or other formats).

The cascading master-slave (MS) clock signals (MS_clkP, MS_clkN) 142 are specifically used for time based synchronization of the sampling moments on the ADCs of several master and slave devices.

For optimal operation of distributed radar systems, it is important that these signals (LO 140, MS clock signal 142 and RFS signal 166) are synchronous across all receiver circuits on different devices. This means that, after calibration of the phase difference between all receiver channels in all master and slave devices, the voltage supply Vcc, temperature and aging variation between all devices distributed in the PCB should not change the initial clock alignment, for example after a one-time calibration operation is performed at radar module level.

A primary problem with such cascaded systems is clock distribution and synchronization. Problems arise due to any misalignment between clock valid and frame start timings between master device and slave device(s), due to different printed circuit board (PCB) delays between components, devices, circuits. This problem is typically overcome by adopting a MS clock distribution process in a star-connection architecture, in order to guarantee the same transmission line lengths and therefore a good clock alignment between the components, devices, circuits. The star-connection architecture is also required for the LO signal to achieve phase coherence when all the TRx channels are used as one antenna array. The requirement to adopt a star-connection architecture for all common signals (LO signal, MS clock, etc.) imposes severe constraints on the PCB design. A common and synchronised phase reference is particularly important in a distributed radar phased array design, in order to steer a beam and control a radiation pattern for the phased array system.

Synchronised clock signals are also used to sample data inside the ADCs of each device. In an FMCW radar device, the synchronized clock edges are used to sample data and control signals that are used to start the modulation. Here, the RFS signal across all devices must be synchronized. This alignment is needed to avoid sampling valid data at different times/moments in the master device(s) and slave devices, which would create phase errors between devices and consequently compromise radar system performance.

Even when adopting a star-connection architecture, a problem occurs when the RFS signal edge is close to a MS clock edge. Particularly in response to process, voltage or temperature (PVT) variations, a master device and one or more slave device(s) may observe RFS re-timed at a different clock edges. This means that for an intermediate frequency (IF) of, say, IF=20 MHz, an error of a complete 240 MHz MS clock cycle can happen. This leads to a phase error of around +/−15 degrees, which compromises radar angular resolution. Modern imaging radar systems specifications allow a maximum of +/−3 degrees of phase error, and this considers errors due to combined ADC sampling and receiver channel variations, as well as some PCB asymmetries. This translates to a stringent required synchronization time accuracy of around 416 psec., for a maximum intermediate frequency (IF) of 20 MHz.

U.S. Pat. No. 6,775,328 B1 proposes a feedback synchronization loop using mV input-output drivers and receivers, U.S. Pat. No. 9,031,180 B2 provides synchronization via a protocol (data frame) in wireless transmitters, U.S. Pat. No. 7,876,261 B1 proposes synchronization between devices using reflected wave clock synchronization. U.S. Pat. No. 6,209,072 B1 uses a de-skewing latch technique in order to obtain a synchronous interface between master device and slave devices. Each of these known techniques is complex and/or require further components and circuits, thereby requiring valuable PCB space and increased cost.

Thus, a mechanism is needed to better support synchronization between shared clocks signals (that use a master-slave clock) and a ramp frame start (RFS) signal in radar units that use multiple radar devices or ICs.

SUMMARY OF THE INVENTION

The present invention provides a communication unit, such as a radar unit, an integrated circuit and methods for clock distribution and synchronization in a master-slave arrangement, as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, byway of example only, with reference to the drawings. In the drawings, like reference numbers are

FIG. 9 illustrates an example flowchart of the steps associated with a radar clock and data synchronization across multiple master device(s)-slave device(s), whereby potential duty cycle problems that may degrade the clock quality (and thus radar system performance) may be removed, according to example embodiments of the invention.

DETAILED DESCRIPTION

Figure 1:
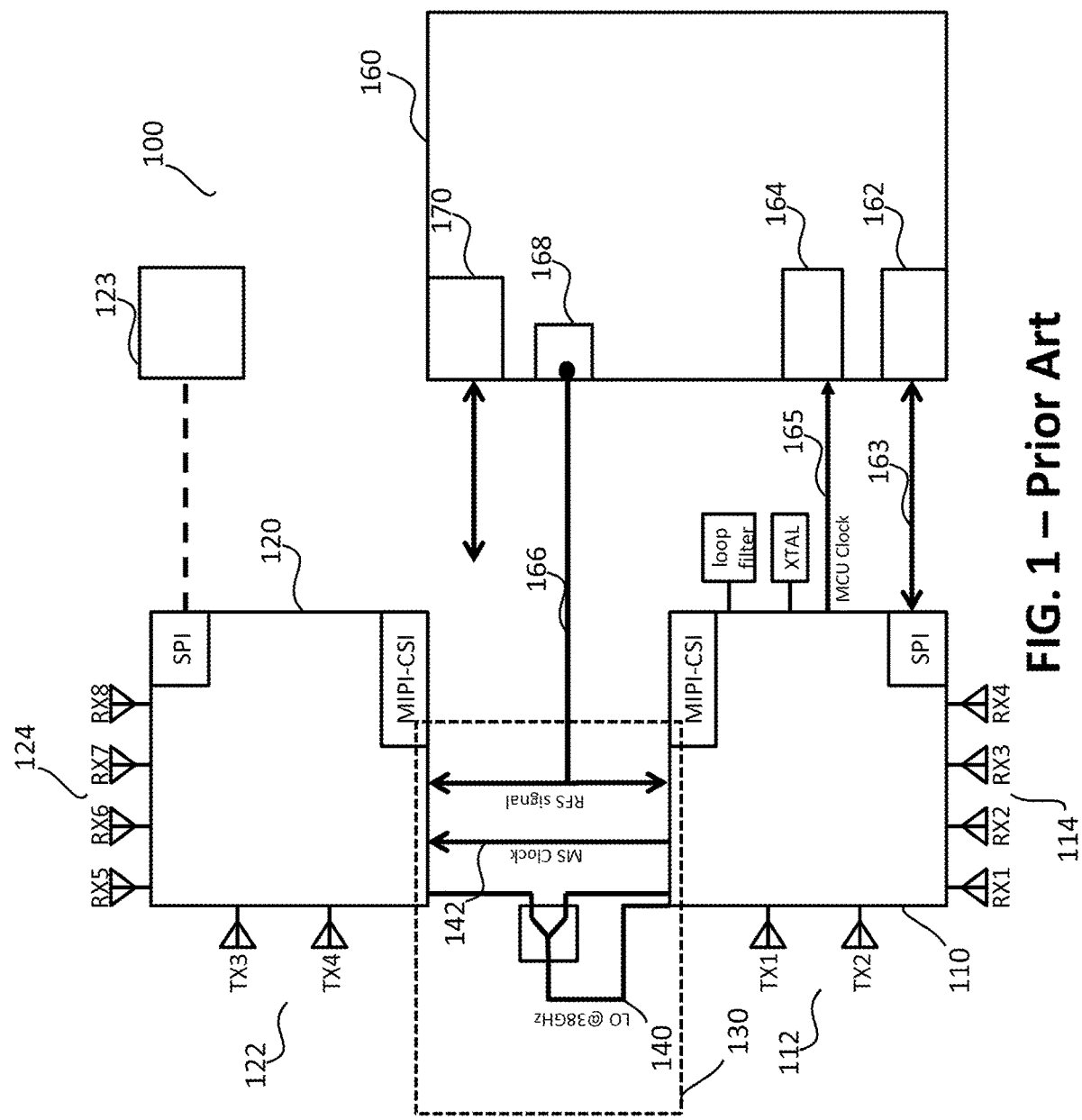
FIG. 1 illustrates a block diagram of a known radar unit that cascades two radar TRx chips.

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

To address the aforementioned synchronization problem between multiple devices or ICs within a communication unit, such as a radar unit, examples of the present invention propose a design that includes a plurality of cascaded devices that comprise at least one master device and at least one slave device configured in a master-slave arrangement. In some examples, the at least one master device and at least one slave device each include: an analog-to-digital converter, ADC, configured to use a same re-created system clock signal to align respective sampling instants between each ADC. The at least one master device comprises: a clock generation circuit comprising an internally-generated reference phase locked loop circuit, configured to output a system clock signal; and a modulator circuit coupled to the clock generation circuit and configured to receive and distribute the system clock signal to the at least one master device and at least one slave device, which each comprise: a demodulator circuit configured to receive the distributed system clock signal and re-create therefrom a synchronized system clock signal used by a respective ADC, of each of the master device and at least one slave device.

In some examples, the at least one master device may embed a frame start signal, such as a chirp start signal (RFS) of a radar unit, within the clock signal. Thereafter, the embedded signal may be shared between the master device(s) and slave device(s) (or ICs) in order to maintain synchronization that is significantly less reliant on PCB construction. Advantageously, the technique to embed a chirp start signal within the distributed master-slave clock signal (sometimes referred to as an ADC clock) enables the slave device(s) (and any other master device(s)) to readily and easily demodulate the distributed master-slave clock signal in order to obtain concurrently the chirp start (RFS). Thus, the master-slave clock distribution and the timing alignment between the master-slave clock signal and the RFS across all devices is inherently synchronized.

In some examples, each of the at least one master device and at least one slave device may be configured to use the same re-created system clock signal such that respective sampling instants between each ADC are time-aligned. In some examples, the at least one master device and at least one slave device may further include a digital controller coupled to the demodulator circuit and configured to re-sample the re-created synchronized system clock signal. In some examples, the clock generation circuit of the at least one master device may be a charge pump phase locked loop. In some examples, the at least one master device and at least one slave device are configured to use low-voltage differential signalling, LVDS, to assist modulation and demodulation of the clock signal.

Such a technique benefits from the fact that the master-slave clock signal is quasi-perfectly synchronized (when using a star routed PCB) and delays of clock edges between different devices during process, voltage or temperature variations (once offset is calibrated) are minimal, e.g. less than one clock cycle error. Thus, in some examples, embodiments of the invention enable a designer to implement a digital cascading radar solution with increased phase aligned performance, where a single reference oscillator (e.g. phase locked loop (PLL)) may be used for all master and slave devices (supplying a reference frequency/clock and a main PLL frequency clock), thereby facilitating phase coherence, clock alignment and clock and RFS synchronization throughout the communication units.

Some examples of the invention enable the RFS signal (ramp frame start or chirp start) to be generated in the master device for synchronicity purposes, and not in the MCU as adopted in known communication units. This approach advantageously removes a need for a dedicated pin in the MCU and removes an additional routing constraint of this signal in the PCB, because the RFS signal is embedded within the distributed MS clock. In this example, the embedding of the RFS signal into the master-slave clock signal (thereby facilitating a distribution of the two signals with no delay between the clock edges of each within the devices), may be achieved using a RFS modulator and a RFS demodulator, implemented in the master-slave clock distribution transmit and receive circuits, respectively.

Some examples of the invention may employ low-voltage differential signalling (LVDS), also known as TIA/EIA-644, in order to assist the modulation and demodulation of the embedded clock signal and chirp signal (i.e. low-to-high or high-to-low transitions) to provide synchronicity across different master device(s) and slave devices. LVDS is a technical standard that specifies electrical characteristics of a differential, serial communications protocol. LVDS operates at low power with programmable output amplitude of voltages and can run at very high speeds using inexpensive twisted-pair copper cables. In some examples, LVDS may be employed in order to reduce interference or signal pollution between supplies, due to current spikes, if CMOS logic were used. Some examples of the invention may take advantage of the fact that LVDS amplitude levels ($V_{diff}$) can be programmed, for example by programming a LVDS transmitter current value ($V_{diff}=2*Idc\_tx*R_{load}$), assuming a constant 100 ohms termination load ($R_{load}$), placed in each LVDS receiver.

Thus, examples of the invention may facilitate digital cascading radar units with increased phase aligned performance, where a single reference PLL may be used in a clock signal generation with embedded frame alignment of frame start signals within a MS clock for distribution between all master device(s) and slave devices. This may ensure optimized phase coherence, sampling clock and chirp start signal alignment, which reduces system phase error, thereby allowing accurate range resolution.

Although examples of the invention are described with reference to synchronization in a star-connected master-slave architecture for a radar unit, it is envisaged that, in other examples, the techniques described herein may be applied to any kind of communication unit or system where several devices or ICs share the same sampling timing, and where another signal may be sent and received embedded within the clock, but synchronous to it (in this example radar scenario, this signal is the 'chirp start' signal).

Although examples of the invention are described with reference to a use of cascaded integrated circuits for, say, a phased array vehicular radar system with many transceiver circuits not located in a same IC, it is envisaged that the examples herein described may equally be employed in a phased array system for general wireless communication applications and units, such as base stations.

Next generation radar solutions will be based on a multichip transceiver configuration where a master device and several slave devices are cascaded coherently to increase the number of transmitter and receiver channels, thereby increasing sensor accuracy in angle resolution. Digital cascading is a preferable solution in order to circumvent the limitation of analog cascading in terms of misalignment of sampling clock of the ADCs and modulation ramp start signal (RFS) between different radar chips.

The master-slave architecture and methods of operation illustrated in FIGS. 2-5 describe a mechanism to remove external misalignment between RFS and MS clocks, and relax PCB requirements on RFS signal. Here, the RFS signal may be embedded inside a clock signal, such as a master-slave clock signal at 240 MHz signal. In some examples of FIGS. 2-5, this may be achieved by adding an RFS modulator on top of a LVDS transmitter for the reference clock, and by adding an RFS demodulator at an LVDS receiver side. In some examples of FIGS. 2-5, amplitude modulation/demodulation may be used to retrieve the RFS signal, without a need for a dedicated pin for RFS.

In order to improve the range resolution of the master-slave architecture and methods of operation illustrated in FIGS. 2-5, the ADC bandwidth and sampling rate may need to be increased, for example by generating (internally) a high frequency and quality clock in order to drive an MIPI interface. In this manner, a receive digital output data path, such as a MIPI digital output, may always sample an analog received signal with a same phase across, channel to channel and device to device, despite any variation in PVT. Thus, in this context, the master-slave architecture and methods of operation illustrated in FIGS. 6-7 describe a mechanism to synchronize 'internally' (to the master or slave devices) and externally synchronize to the (PCB) clocks and data on the master or slave devices, in such a manner that the total radar receiver phase variation does not change significantly over PVT. In particular, in some examples, the internal synchronization may guarantee that all ADC outputs and high-speed receiver output data interfaces, such as MIPI interface outputs, belonging to different ICs, do not vary over PVT, for example within a defined range of one system clock cycle. In these examples, the internal PLL and PLL reference clocks (e.g. the crystal oscillator clock signal in master device and internal divided MS_CLK clock signal in slave device(s)) are combined with an RFS signal. In this manner, the clocks driving the ADCs and high-speed receiver output data interfaces, such as MIPI interfaces, may be configured to present a high performance in terms of phase noise/jitter and duty cycle, in order to achieve good ADC SNR and meet, say, a skew MIPI alliance standard specification.

Figure 6:
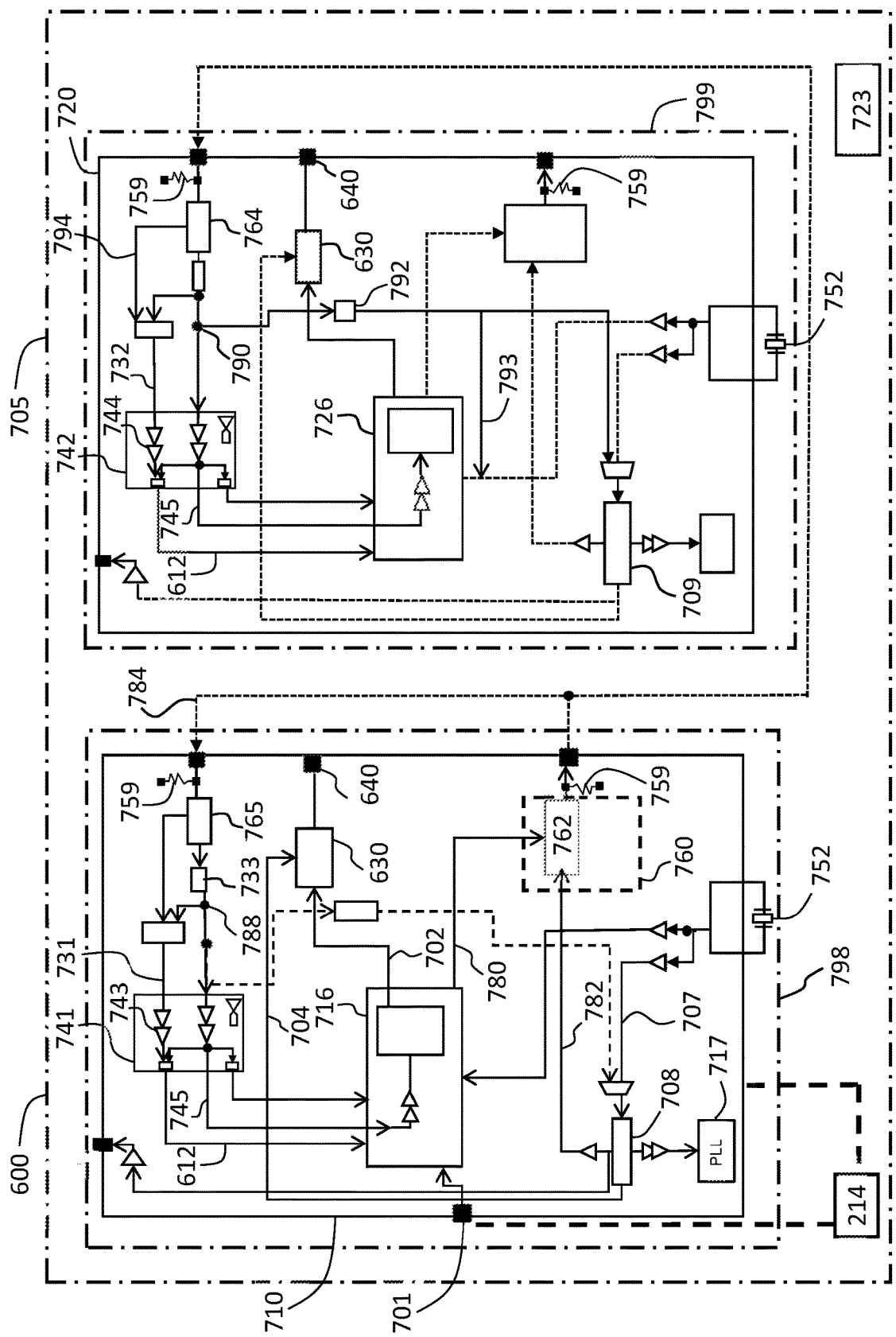
FIG. 6 illustrates an example block diagram of a master device-slave device arrangement configured to provide a radar clock and data synchronization, according to some examples of the invention.
Figure 7:
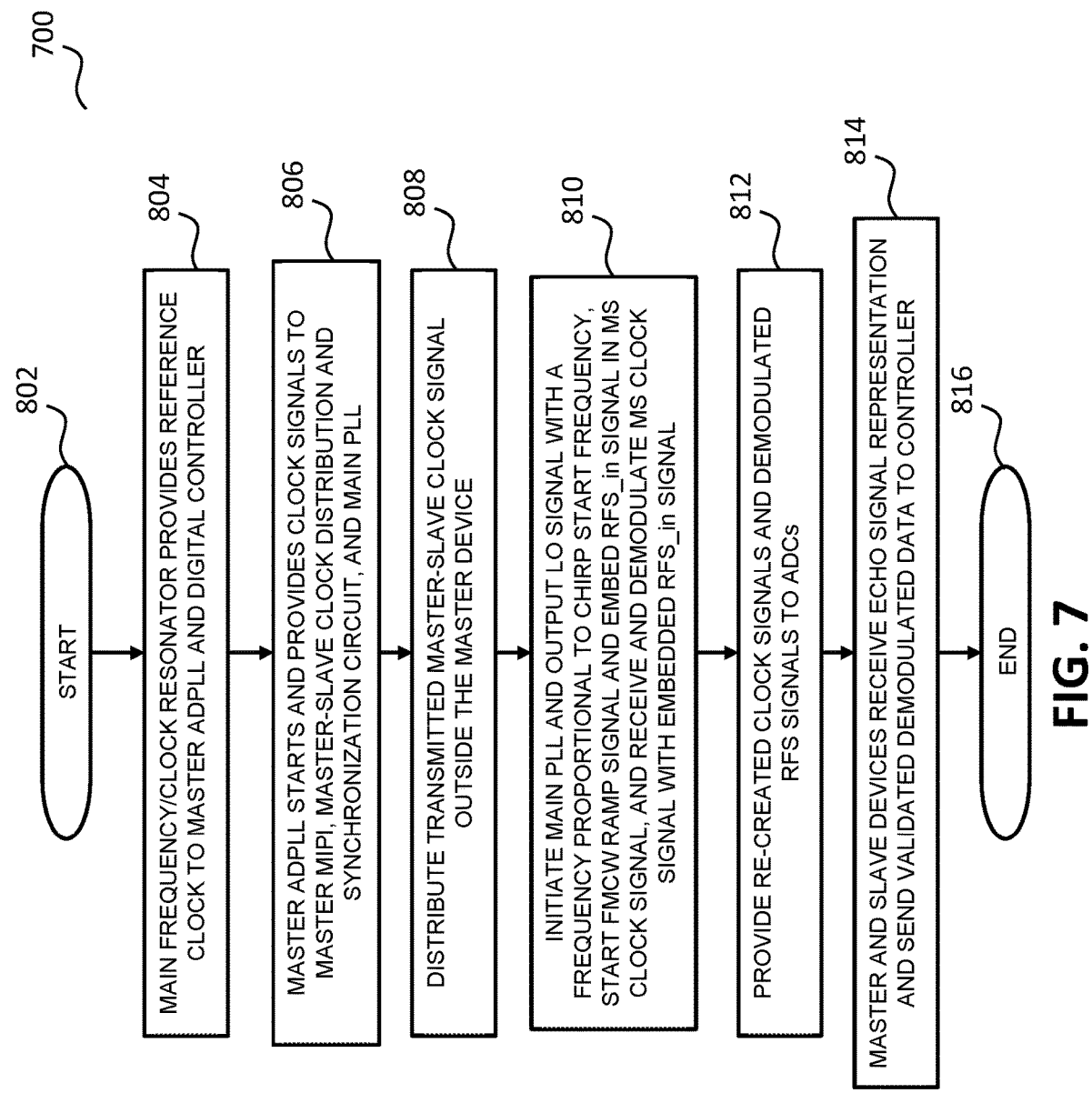
FIG. 7 illustrates an example flowchart of the steps associated with a radar clock and data synchronization across multiple master device(s)-slave device(s), according to example embodiments of the invention.

In some instances, the inventors have recognised and appreciated that a duty cycle may be corrupted when using an external clock of FIG. 6 or FIG. 7, should the PCB routing be non-symmetrical, which may in turn degrade the clock quality and thus the radar system performances. Thus, in some examples and as described in FIG. 8 and FIG. 9, the inventors propose an architecture that keeps the system phase noise very low, using say, a charge pump-based PLL compared to the ADCPLL in FIG. 6, since the phase noise contribution of such a reference PLL may be ignored. In this example, a main PLL may be driven by a clock signal coming directly from a crystal oscillator at, say, 120 MHz, and not from a reference PLL (e.g. an ADCPLL, or charge pump-based PLL). Thus, in this example, a communication unit (such as a radar unit) includes a plurality of cascaded devices that comprise at least one master device and at least one slave device configured in a master-slave arrangement. The at least one master device and at least one slave device each include: a demodulator circuit configured to receive a distributed reference clock signal and re-create a system clock signal therefrom; a clock generation circuit that includes an internally-generated reference phase locked loop configured to receive the re-created system clock signal to create a master-slave clock signal; and an analog-to-digital converter, ADC, coupled to the reference phase locked loop and configured to use a same master-slave clock signal to align respective sampling instants between each ADC of the at least one master device and at least one slave device.

Figure 2:
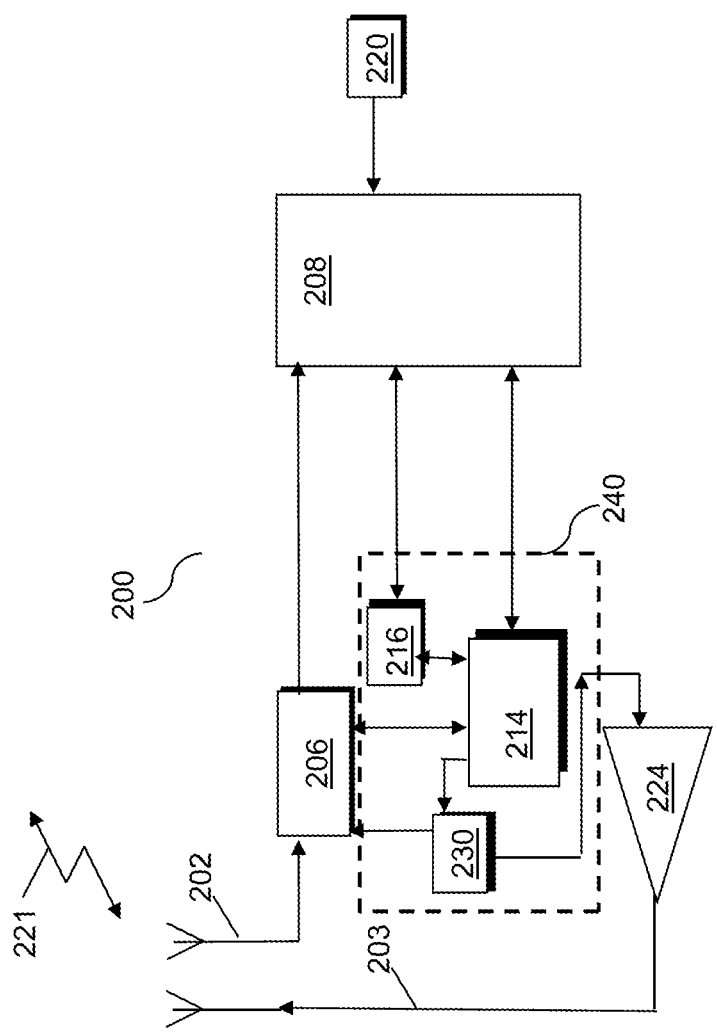
FIG. 2 illustrates an example block diagram of a radar unit adapted according to example embodiments of the invention.

Referring to FIG. 2, a block diagram of an example wireless communication unit is shown, adapted in accordance with some examples of the invention. Purely for explanatory purposes, the wireless communication unit is described in terms of a radar unit 200, for example operating at millimeter wave (mmw) frequencies. However, in other examples, it is envisaged that the concepts described herein may be employed in any communication unit that utilizes a master-slave device arrangement.

The radar unit 200 contains one or several antennas 202 for receiving radar signals 221, and one or several antennas 203 for transmitting radar signals, with one shown for each for simplicity reasons only. The number of antennas 202, 203 used may depend on the number of radar receiver and transmitter channels that are implemented in a given radar device. One or more receiver chains, as known in the art, include receiver front-end circuitry 206, effectively providing reception, frequency conversion, filtering and intermediate or base-band amplification, and finally an analog-to-digital conversion. In some examples, a number of such circuits or components may reside in signal processing module 208, dependent upon the specific selected architecture. The receiver front-end circuitry 206 is coupled to the signal processing module 208 (generally realized by a digital signal processor (DSP)). A skilled artisan will appreciate that the level of integration of receiver circuits or components may be, in some instances, implementation-dependent.

The microcontroller unit (MCU) 214 maintains overall operational control of the radar device 200, and in some examples may comprise time-based digital functions (not shown) to control the timing of operations (e.g. transmission or reception of time-dependent signals, FMCW modulation generation, etc.) within the radar unit 200. The MCU 214 is also coupled to the receiver front-end circuitry 206 and the signal processing module 208. In some examples, the MCU 214 is also coupled to a memory device 216 that selectively stores operating regimes, such as decoding/encoding functions, and the like.

As regards the transmit chain, this essentially comprises a power amplifier (PA) 224 coupled to the transmitter's one or several antennas 203, antenna array, or plurality of antennas. In radar unit 200, radar transceiver topology is different from traditional wireless communication architectures (e.g. Bluetooth™, WiFi™, etc.), as modulation occurs within a phase locked loop (PLL) (typically via a fractional-N divider), and is applied directly to the PA 224. Therefore, in some examples, the receiver front-end circuitry 206 and transmitter PA 224 are coupled to frequency generation circuit 230 arranged to provide radio frequency (RF) local oscillator (LO) signals. The generated RF LO signals are thus modulated directly to generate transmit radar signals, and also used to down-convert received modulated radar signals to a final intermediate or baseband frequency or digital signal for processing in a receive operation.

In examples of the invention, digital cascading of multiple master and slave devices is achieved by sending a reference clock signal generated in a master device to both other master device(s) and one or more slave device(s). In examples of the invention, the reference clock signal has been adapted by embedding a start of a frame (RFS) indication in the clock signal, which in some examples is a master-slave clock signal. In some examples, the generation and distribution of the MS clock signal with an embedded start of a frame indication may be implemented via a star connected LVDS link, for example to reduce PCB skew and reduce signal reflections that could compromise signal integrity and increase jitter.

To remove any misalignment between RFS and the MS clock signal, as well as relax PCB requirements on the RFS signal, examples of the invention embed the RFS (sometimes referred to as a modulation chirp start) inside the master-slave clock signal, by adding an RFS modulator in a LVDS transmitter for generating a reference clock, and by adding an RFS demodulator at a LVDS receiver side. Thereafter, for example, amplitude modulation/demodulation may be used to retrieve the RFS signal, advantageously without a need for one or more dedicated RFS pin(s).

In accordance with examples of the invention, the use of improved synchronization between respective master device(s) and one or more slave device(s) may then allow correct operation of the communication unit, e.g., that implements an N-unit phased array, FMCW imaging radar system. For identical units, the use of a phased array increases the sensitivity by 'N' times, as compared to that of a single unit. In a radar transmitter mode of operation, beam steering can also be implemented by shifting the phase of the transmitting signals of an N-unit phased array radar system. For multiple mid-range radar units, the inputs to an N-unit phased array radar system can be combined in order to increase the radar transmit power, and thereby allow longer range applications. Such benefits may result from the use of improved synchronization between respective master device(s) and one or more slave device(s).

In one example of the invention, the embedding of a chirp start signal within a clock signal, which is shared between the master device(s) and slave device(s) (or ICs) in order to maintain synchronization, may result in an enabling of more flexible PCB design without the constraints of a strict transmission line or connection length between the master device(s) and slave device(s).

Furthermore, a smaller MCU for, say, a phased array FMCW imaging radar system, may be achieved by eliminating a need for an additional one pin on MCU (when the RFS is provided by the MCU in the known architecture (ii)) or two dedicated RFS pin(s) on the master device (when the RFS is provided by the master device in known architecture (i)).

Some examples of the invention employ synchronization in order to minimize any delay mismatch in either the LO/frequency generation circuitry and/or analog-to-digital converter (ADC) sampling instants (which would ordinarily have led to angle estimation errors) as well as transmit control, frequency chirp start control signals. Examples of the invention employ synchronization in an FMCW radar unit, particularly to align the frequency chirp start and end frequencies.

Furthermore, examples of the invention allow multiple radar transceiver chips to be located on different PCBs or modules in order to reduce installation complexity in a constructing of an adaptive phased array FMCW imaging radar system on a non-planar vehicle surface. Clearly, the various components within the radar unit 200 can be realized in discrete or integrated component form, with an ultimate structure therefore being an application-specific or design selection. A skilled artisan will appreciate that the level of integration of circuits or components may be, in some instances, implementation-dependent.

Figure 3:
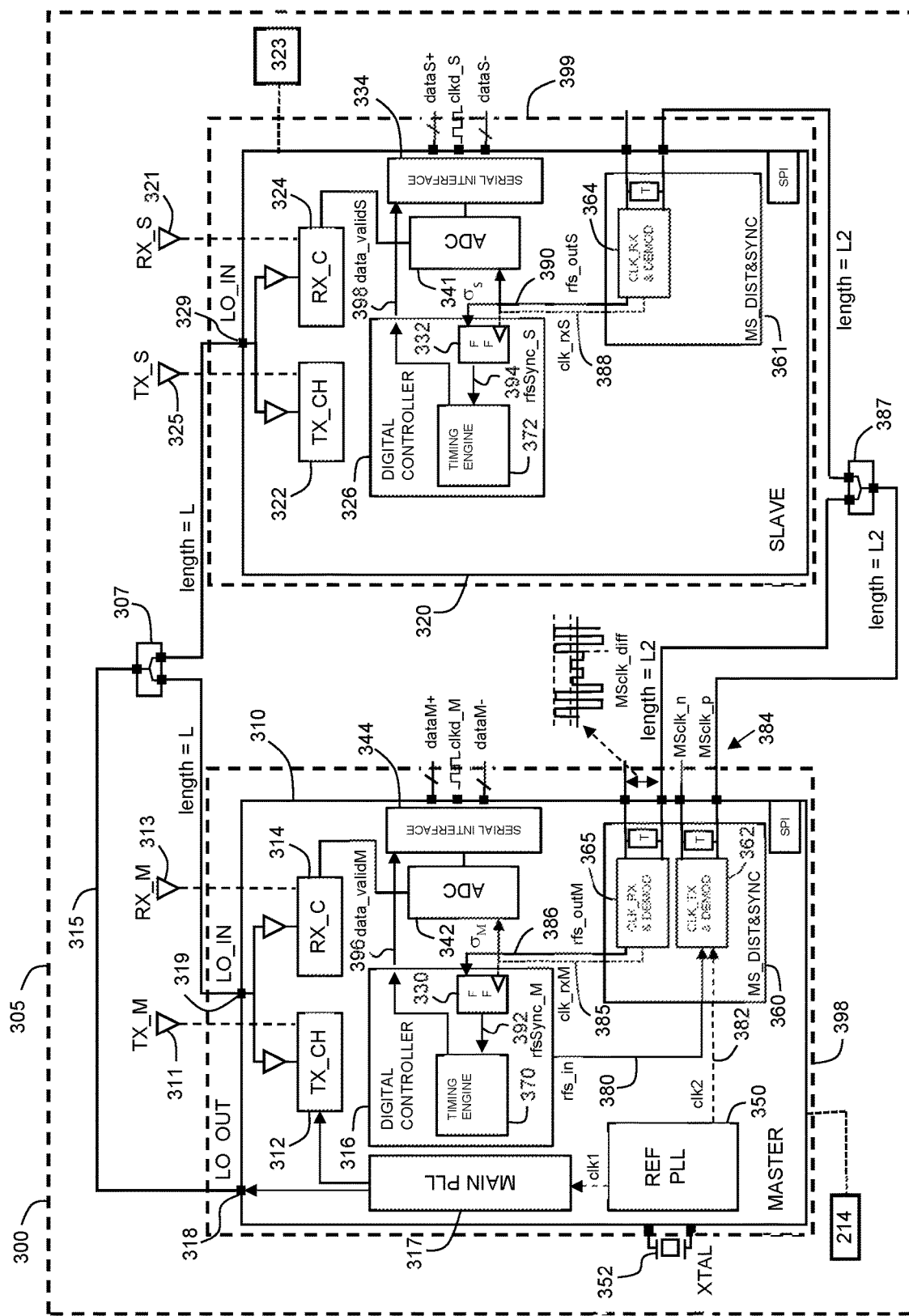
FIG. 3 illustrates an example diagram of a radar unit that cascades multiple chips in a Master Slave synchronization approach, according to example embodiments of the invention.

Referring now to FIG. 3, an example block diagram of a communication unit 300 having a master-slave architecture is illustrated. In this example, the master-slave architecture is illustrated as a radar unit 305 that includes a master device 310 and one or multiple slave devices 320, 323. One slave device 320 is shown for clarity purposes only, with the potential for other similar slave devices shown as 323.

In this example, the master device 310 incorporates a radar transceiver formed by at least a frequency generation circuit, which in this example includes a reference phase locked loop (PLL) 350 and a main PLL 317. An output from the main PLL 317 provides a local oscillator (LO) signal to a local oscillator output pin 318, which is routed via a LO_out path 315 to a RF splitter 307 that is coupled to each master and slave LO input pin (LO_in) 319, 329 via, say, an equal transmission line length (e.g. via a star configuration). In some examples, by using equal transmission line lengths, it is possible to ensure equal delay and phase aligned signals for the LO, applied across all master device(s) 310 and slave devices 320, 323 for the generation and reception of radar signals.

The master device 310 further includes a digital controller 316 and a transmitter circuit 312 comprising one to several transmitter channels (TX_CH) and a receiver circuit 314 comprising one to several receiver channels (RX_CH). In a transmitter mode of operation in the master device 310, the digital controller 316 may provide a transmit radar signal to the main PLL 317 to generate a modulated transmit signal. The modulated transmit signal is then optionally passed to a buffer or frequency multiplier in the transmitter circuits 312, 322 (if the generated signal is not at the operating frequency of the radar unit 305) of the respective master device(s) 310 and slave device(s) 320. A high-frequency output of the transmitter circuit 312 is passed to a power amplifier, say, via a phase shifter circuit (both not shown), where it is amplified within transmitter circuit 312 and routed to the one or more transmitter antenna(e) 311 (and in some examples routed to the one or more transmitter antenna(e) 325 in the one or more slave device(s) 320.

In a receiver mode of operation in the master device 310 and slave device 320, a received radar signal may be received at the one or more receiver antenna(s) 313, 321 and passed to master and slave receiver circuits 314, 324 that include a low noise amplifier (LNA) configured to amplify the received radar signal. The amplified received radar signal is passed to a down-mixer, where it is mixed with the received high-frequency LO signal 315 received from the master device 310.

The master device 310 further includes one or more programmable bandpass filter(s) and one or more gain amplifiers (not shown), as well as one or several ADC(s) 342 that is/are coupled to the one to several receiver channels (RX_CH) 314 as well as a serial interface 344. The one or several ADC(s) 342 process a relative narrow band signal, for example in a range between a few kHz up to tenths of MHz.

In accordance with examples of the invention, the master device 310 further includes a master-slave clock distribution and synchronization circuit 360. In this example, the reference clocks are generated on the master device 310 using the reference PLL 350, tied to an external crystal oscillator 352, and sent as a first clock signal (clk1) to the main PLL 317 and a master-slave clock signal (clk2) 382 to master-slave clock distribution and synchronization circuit 360.

In this example, the master-slave distribution and synchronization circuit 360 is configured to embed a frame start signal, such as a chirp start (RFS_in) signal 380 in a radar unit, into the master-slave clock signal (clk2) 382 received from reference PLL 350. Embedding the chirp start (RFS_in) signal 380 into the master-slave clock signal (clk2) 382 allows the two signals to be distributed across all master slave devices with inherent synchronization and no delay between devices. In this example, the result of the embedding operation is a (distributed and received modulated) differential master-slave clock signal 384. In this example, master-slave distribution and synchronization circuit 360 uses a RFS modulator 362 (implemented in, say, a LVDS transmit circuit) to embed the chirp start (RFS_in) signal 380 into the master-slave clock signal (clk2) 382, and a RFS demodulator 364 (implemented in, say, a LVDS receive circuit) to respectively de-embed (e.g. demodulate) the differential master-slave clock signal 384 into a slave RFS_out signal 390 and a master-slave slave clock signal 388. Similarly, in the master device, a fed back (distributed and received modulated) differential master-slave clock signal 384 is also received in master-slave clock distribution and synchronization circuit 360.

In response to a serial-parallel interface (SPI) command coming from the MCU 214, the digital controller 316 of the master device 310 provides a chirp start signal (rfs_in) 380 that will be used by each of the master device(s) 310 and slave devices 320, 323 of the radar unit 305. The rfs_in signal 380 is provided to the master-slave clock distribution and synchronization circuit 360, and it is embedded on the master-slave clock signal (clk2) 382 by the RFS modulator 362. In this example, the RFS modulator 362 is an LVDS transmitter circuit that produces a modulated/embedded output LVDS signal. In one example, as illustrated, the modulated/embedded output LVDS signal may be a differential master-slave clock synchronization signal with embedded RFS signal 384 (MSclk_n & MSclk_p). In this example, the RFS modulator 362 (and RFS demodulator 364) may be terminated by a 100 ohms differential resistor (T), as well as all other slave LVDS clock RFS demodulators, in order to reduce any reflections due to LVDS link asymmetry, which may corrupt the signal integrity and cause false zero crossings.

In accordance with examples of the invention, the differential master-slave clock synchronization signal with embedded RFS_in signal 384 (i.e. containing both clock & chirp start) may then be propagated to a number/all devices of the radar unit 305 via an equal length (L2) star connection and splitter 387, in order to limit any printed circuit board (PCB) skew or PCB assymetries to very low values (e.g. of the order of <100 psec).

In this example, each radar slave device 320, 323 includes a digital controller 326 and a transmitter circuit 322 comprising one to several transmitter channels (TX_CH) and a receiver circuit 324 comprising one to several receiver channels (RX_CH). The slave device 320 further includes one or several ADC(s) 341 that is/are coupled to the one to several receiver channels (RX_CH) 324 as well as a serial interface 334. In accordance with examples of the invention, the slave device 320 further includes a slave-based master-slave clock distribution and synchronization circuit 361, where only the LVDS receiver is enabled. In this example, the slave-based master-slave distribution and synchronization circuit 361 is configured to demodulate and extract the chirp start (RFS) signal 380 from the differential master-slave clock synchronization signal with embedded RFS_in signal 384. In this example, slave-based master-slave distribution and synchronization circuit 361 uses an RFS demodulator 364 implemented in LVDS.

In some examples, as appreciated by a skilled person, the slave device 320 may be configurable as a master device 310, but with a number of circuits or components or functionality disabled. For example, in such a slave device 320, since the clock and sync signal as well as LO signals are received from the master device 310, a slave reference PLL, main PLL and the MS_CLK transmit circuits are disabled. Many other blocks may be present inside the slave device, but are not mentioned herein to avoid obfuscating concepts of the invention.

The respective RFS slave demodulator 364 is configured to extract respective slave clock signals (clk_rxS 388) in a CMOS format with very low delay variation between that clock and the master clock signal (clk_rxMS 385). In addition, the respective RFS demodulators 364, 365 are configured to demodulate the transmitted chirp start signal (rfs_in 380) in each respective device. Since the respective RFS master modulator 385, generates the clock signal (clk_rxM) and RFS master demodulator 365 and RFS slave demodulator 364 demodulate the respective master clock signals (clk_rxM 385) and slave clock signals (clk_rxS 388) that are very closely aligned, they are used to re-sample the respective master (rfs_outM) 386 and slave (rfs_outS) 390 device chirp output signals. In this manner, the RFS master demodulator 365 and RFS slave demodulator 364 create synchronized chirp start signals (rfsSync_M 392, rfsSync_S 394) at respective inputs at time engines 370, 372. In this example, in the slave device, this sampling operation is performed in the digital domain, inside respective digital controller 326, by flip-flop 332. In the master device, this sampling is performed inside digital controller 316, by flip-flop 330.

A skilled artisan will appreciate that many other circuits, components and blocks may be present inside a master device 310 and slave device 320, but that these have been omitted purely for clarity purposes. In this manner, a system, such as a phased array FMCW imaging radar system, employing example embodiments of the invention relating to a master-slave arrangement, may be able to benefit from improved clock synchronization accuracy in a multiple chip configuration.

In some examples, the master device 310 is configured to generate and distribute a master-slave clock 384 from a MS_clock LVDS transmit modulator 362 path to the MS_clock LVDS receive path inside slave devices, and back to master device LVDS RX demodulator 364, in, say, a star configuration. In this manner, in some examples, an ADC clock applied to both master device(s) and slave devices may be perfectly aligned, so long as the transmission line length to each of the receivers is matched. Furthermore, in some examples, the clock signal with an embedded start of a frame indication may be used to sample the data inside different ADCs belonging to different ICs, in order to reduce phase error and consequently angle resolution at sensor level.

Also for example, in one embodiment, the illustrated examples of a master device 310 or slave device 320 may be implemented as circuitry located on a single integrated circuit 398, 399. Alternatively, the circuit and/or component examples may be implemented as any number of separate integrated circuits 398, 399 interconnected with each other in a suitable manner. The specifications and drawings are, accordingly, to be regarded in an illustrative rather than in a restrictive sense.

Figure 4:
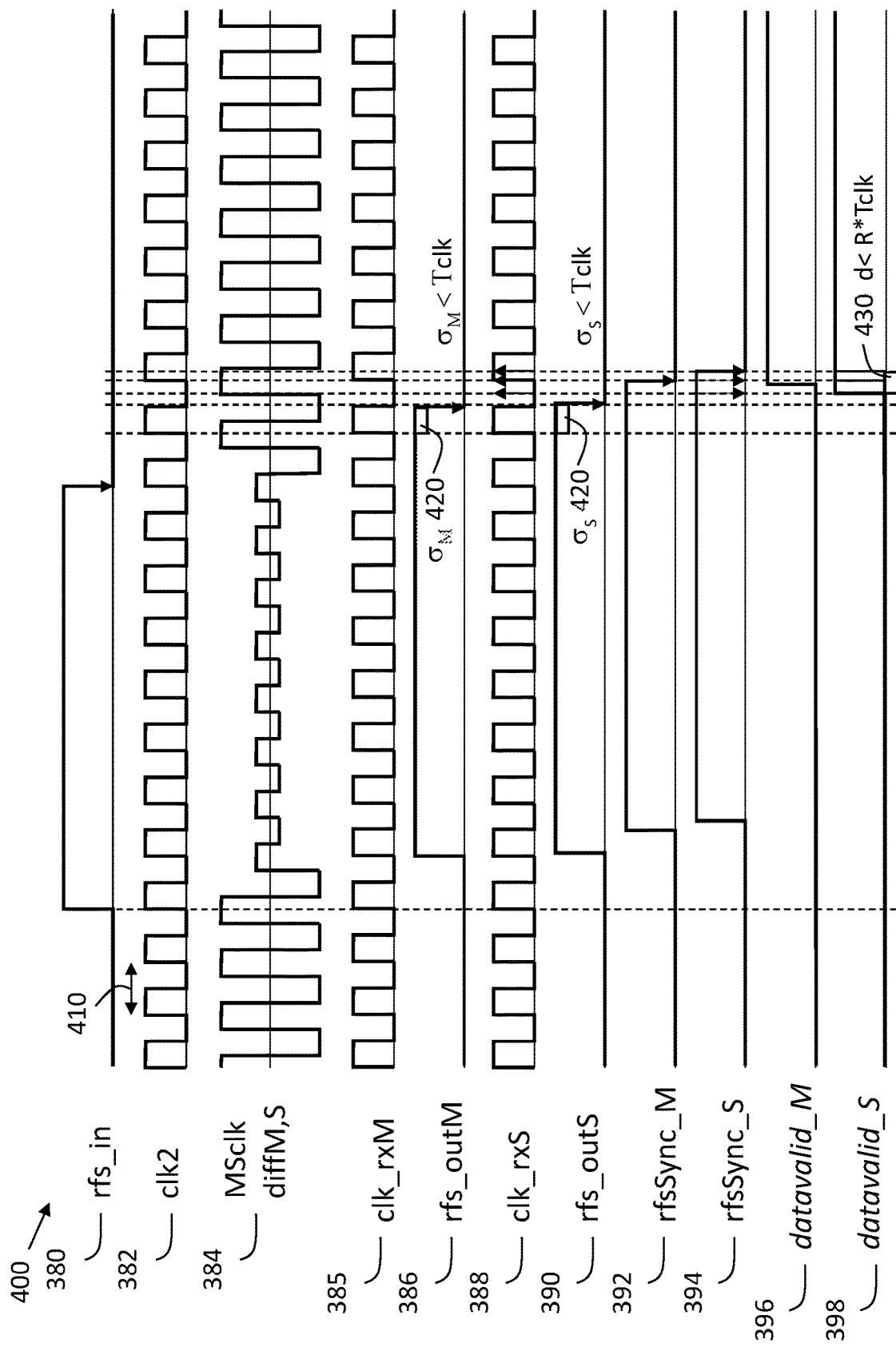
FIG. 4 illustrates a timing diagram of a synchronization method, according to example embodiments of the invention.

Referring now to FIG. 4 (and with reference to FIG. 3), a timing diagram 400 of a synchronization method between master device and one or more slave device(s) is illustrated, according to example embodiments of the invention. In order to obtain phase coherence in, say, a master-slave arrangement based radar unit, such as radar unit 305 of FIG. 3, local oscillator (LO) and clock signals are shared between all devices of the radar unit. In accordance with examples of the invention, the LO signal is provided from the master device (via a LO_out path/pin 318) to each LO_in path/pin 319, 329 present in both master device(s) 310 and slave device(s) 320, 323. In this case, LO_out signal is star routed using equal length (L) transmission/communication lines and power splitters to guarantee phase aligned signals.

The reference clocks are generated on master device 310 using the reference PLL clock signal (clk2) 382, tied to an external crystal oscillator 352, and sent to RFS modulator 360. Under, say, a SPI command from the MCU 214, the digital controller 316 of the master device 310 provides a chirp start (RFS_in) signal 380 to the RFS modulator circuit 360, which is configured to embed (e.g. encapsulates) the chirp start (RFS_in) signal 380 into the master-slave clock signal (clk2) 382 received from reference PLL 350. In this example, the embedded chirp start (RFS_in) signal 380 takes a form of differential master-slave clock signal (MS_clkdiff) 384, which is then used by all the master device(s) 310 and slave devices 320 of the system. In FIG. 3, the RFS modulator circuit 360 may be an LVDS transmitter and the differential master-slave clock signal (MS_clkdiff) 384 may take a form of an LVDS signal, MSclk_n & MSclk_p.

In some examples, the use of LVDS facilitates programmability of output voltages and supports very high data speeds. In some examples, LVDS may be employed in order to reduce interference or signal pollution between supplies due to current spikes if CMOS logic were used.

This differential master-slave clock signal (MS_clkdiff) 384 containing clock & chirp start is then transmitted by the master device 310 to all devices of the system, and is received by both master device(s) 310 and slave devices 320. Master-slave clock distribution and synchronization circuits 360, 361 are configured to extract the clock signals (clk_rxM 385 & clk_rxS 388) in a CMOS format with very low delay variation between both clocks, as well as to demodulate the transmitted chirp start signal (RFS_in) 380 in both the master device(s) 310 (to produce a reproduced chirp start signal rfs_outM 386) and slave devices 320 (to produce a reproduced chirp start signal rfs_outS 390). Since the respective clock signals present a very good alignment, as illustrated, advantageously with very low absolute delay and delay variations, they are used to re-sample the reproduced chirp start signals rfs_outM 386 & rfs_outS 390. In this manner, synchronized chirp start signals (rfsSync_M 392 and rfsSync_S 394) are created at inputs to the respective time engines 370, 372. In some examples, this sampling is performed in the digital domain, inside digital controller 316, 326 by flip-flops 330, 332.

In some examples, in order to obtain this re-sampling in a digital domain, at least one master-slave clock distribution and synchronization circuit 360 in the master device 310, and at least one master-slave clock distribution and synchronization circuit 361 in the slave device 320 may be arranged such that clock extraction circuitry that generate signals (clk_rxM, clkrxS) do not introduce a problematic delay (σM, σS 420) due to, say, any of process, voltage, temperature (PVT) variations, for example where the variations during a communication unit design phase are constrained to be smaller than one clock cycle (Tclk) 410, to avoid introducing re-sampling errors on RFS_signals (rfs_outM, rfs_outS). In some examples, a clock extraction circuitry generates signals (clk_rxM, clkrxS) that are only allowed to introduce a delay (σM, σS <Tclk 420) of up to half of a clock period of the system clock signal (388, 385) due to any of process, voltage, temperature, PVT variations. The inventors of the present invention have identified that a more acceptable ratio is one eighth of a clock period delay of the system clock signal 388, 385. Any variability is well controlled to guarantee that the datavalid signals (datavalidM 396, datavalidS 398), which are used to set sampling time of data at ADC side, are accurately time aligned on all master device(s) and slave devices, with a maximum delay (d) defined by the overall radar phase variation specification (d=<R*Tclk) 430.

In one example operation, it is envisaged that the radar units that include a built-in inter-chip localization feature may be employed in radar units in vehicles. Examples of the invention may be additionally employed to support beam steering control in a phased array radar system across multiple sensors, in some examples having multiple chips.

Examples of the invention propose a method for clock distribution and synchronization in a communication unit having at least one master device and at least one slave device configured in a master-slave arrangement and configured to process at least one of: transmit signals, and receive signals. The method includes, at a master device: generating a system clock signal and generating a frame start signal. The method further includes embedding the frame start signal into the system clock signal to produce a modulated embedded master-slave clock signal. The modulated embedded master-slave clock signal is then transmitted to at least one slave device to synchronise the system clock signal and a frame start signal between the at least one master device and at least one slave device.

Figure 5:
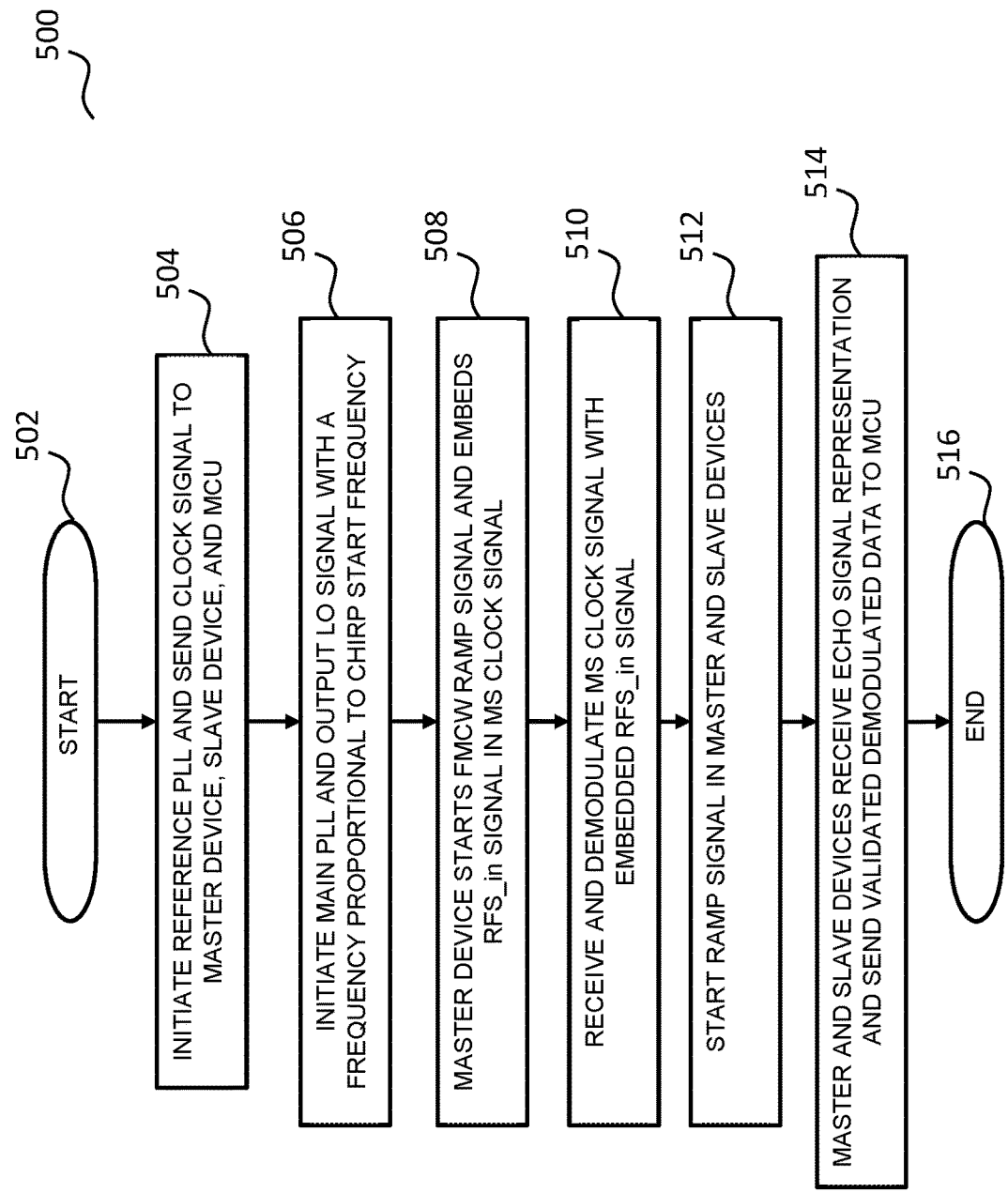
FIG. 5 illustrates an example flowchart of the steps associated with synchronization across multiple master device(s)-slave device(s), according to example embodiments of the invention.

Referring now to FIG. 5 an example flowchart 500 of the steps associated with synchronization across multiple master device(s)-slave device(s) is illustrated, according to example embodiments of the invention. The flowchart starts at 502, with a start-up of at least the master device and/or a MCU. At 504, the reference phase locked loop (PLL) of the radar unit is initiated. In some examples, at 504, a clock signal is sent to master device(s) and slave device(s) and the MCU. In one example at 506, a main PLL is initiated and a waveform generator of a master device controls its VCO to output a LO signal with a fixed frequency that is proportional to a chirp start frequency, $f_{start\_master}$. In one example application, one or more slave device(s) are initiated to receive the signal from the master device, and accordingly adjust their LO frequency to be the same as that in the master device.

In examples of the invention, at 508, a master device starts a FMCW ramp signal and embeds a RFS_in signal within a MS clock signal. In some examples, the MS clock signal is then sent to all other master device(s) and slave device(s). At 510, the MS clock signal with an embedded RFS_in signal is received and demodulated in each of the master device(s) and slave device(s). At 512, the ramp (chirp) signal starts in each of the master device(s) and slave device(s). At 514, each of the master device(s) and slave device(s) receive a representation of an echo signal and send validated, demodulated data to the MCU based on the synchronised clock signal with an embedded RFS_in signal. In this manner, synchronization between the master device(s) and slave device(s) is achieved, after which, all the master device(s) and slave device(s) have the same frequency chirp start and chirp end frequencies, as well as the same sampling clock. The data sampled by all of the devices (or ICs) including the ADC is now substantially synchronous. The flowchart ends at 516.

In order to improve the range resolution, it is known that the ADC bandwidth and sampling rate needs to be increased, with a consequent need to generate internally a high frequency and quality clock to drive the high-speed receiver output data interfaces, such as MIPI interfaces. Furthermore, a radar baseband receiver needs to guarantee the synchronization of the RFS with high quality clocks. Indeed, ADCs and MIPI interfaces need to operate with high quality clocks. A high quality clock is needed on ADC to reach the radar unit's SNR specification, whilst a high quality clock is needed by MIPI interfaces in order to reach the MIPI Tskew specification, i.e. a data to clock skew limit from MIPI standard. A high quality clock that is capable of meeting the MIPI specification requires a very good duty cycle (<+/−2%) and low jitter (<4 ps). The MIPI specification further requires a limit of data to clock skew of +1-0.15 UI. This limit is important because, if it is exceeded, it can degrade receiver performance to prevent the receiver being capable of properly detecting the signal content (e.g. closure of the eye diagram, increase bit error rate (BER) or frame error rate (FER), etc.).

In order to remove internal misalignment of the radar received data and clocks within different ICs, and guarantee a high quality clock on an ADC and a MIPI interface, further examples of the invention describe a mechanism that combines an internal PLL reference clock with a RFS modulator/demodulator mechanism. In some examples, the internal PLL reference clock may be provided by a crystal oscillator (Xtal) signal in the master device and an internally divided master-slave clock (MS_CLK) in the slave device(s).

Referring now to FIG. 6, an example block diagram 600 of a master device-slave device arrangement configured to provide a system clock and data synchronization is illustrated, according to some examples of the invention. In this example, the master-slave architecture is illustrated as a radar unit 705 that includes a master device 710 and one or multiple slave devices 720, 723. In this example, the dashed lines are standard components and communication lines within the devices that are respectively disabled, whereas the solid lines indicate that the communication lines and signals have been enabled for that particular device. One slave device 720 is shown for clarity purposes only, with the potential for other similar slave devices shown as 723. In this example, the master device 710 incorporates a frequency generation circuit, which in this example includes a main phase locked loop (PLL) 717. An output from the ADCPLL 708 provides a reference clock signal, of say, 120 MHz in this example, to the main PLL 717. In some examples, the ADCPLL 708 may be an XOR-based ADCPLL 708, which provides better phase noise, is very small, and can be used to only clock the MIPI interface on each master device and slave device with a very high clock speed as shown in FIG. 6.

In such XOR-based ADCPLL 708 designs, some examples of the invention propose a different strategy for the ADCs, as XOR based PLLs have an unequal phase relationship between the output phase and the input phase. Hence, it is not possible to guarantee the same phase relationship across each master device or slave device MIPI, unless each master device uses its ADCPLL and each slave device uses its ADCPLL. Thus, in order to ensure that the sampling time employed at all ADCs is the same, each ADC clock on master device and slave device(s) is supplied from the same source, i.e. the MS clock from the master device ADCPLL 708. This clock signal is distributed via an external clock distribution link to clock all ADCs of all die, as illustrated in FIG. 3 (in an 'outside' synchronisation manner whereby the same clock is distributed via LVDS transmitter, receiver and is star routed). Thus, in this manner, the MIPI requirement on having a very good duty cycle (which impacts Tskew) is achieved by internal distribution, and ADC in-phase sampling that is achieved by external clock distribution.

In accordance with examples of the invention, the ADCPLL 708 of the master device 710 is also tied to an external crystal oscillator 752. In this manner, an internal ADCPLL uses a XOR-based PLL that is configured to generate internally an ADC clock with an expected or desired duty cycle and jitter performance for the ADC. Furthermore, the ADCPLL 708 of the master device 710 generates a high-speed receiver output data interface clock, such as MIPI interface clock, whilst maintaining a constant phase relationship between all of the output clocks and input clocks within or coming from the master device 710. A generated ADCPLL output signal 782 at, say, 240 MHz in this example, is sent as a first clock signal to a master-slave clock distribution and synchronization circuit 760, which includes a RFS modulator 762.

In some examples of the invention, a RFS signal is generated by the master device 710 in response to a SPI command (e.g. RFSout signal 780). The RFSout signal 780 is modulated inside the clock within the master-slave clock distribution and synchronization circuit 760, which includes a RFS modulator 762, and is then sent to both RFS and system clock demodulator circuits 764, 765 on the respective slave device and master device. At the RFS and system clock demodulator circuits 764, 765, the system clock is re-created and RFS signal is de-embedded in both Master and Slave devices to produce synchronised RFSsynched signals 731, 732. The RFSsynched signals 731, 732 are thus provided to the respective ADCs 741, 742 with symmetrical clock trees, thereby ensuring that they are each synchronous at ADC output (612, 745) of both master device 710 and slave device(s) 720, 723. The de-embedded, digital RFS_in signals (RFSin) 612 in both master device 710 and slave device(s) 720, 723 are then routed to the digital controllers 716, 726, which are now configured to start the FMCW ramp in a synchronous manner.

The inventors have recognised that the serial MIPI interface needs a very fast clock (e.g. of an order of 960 MHz in this example), in order to support increasing data rate and throughput. Thus, in examples of the invention, the inventors propose to achieve a very fast clock for the MIPI interface by using the very fast clock provided by a XOR based ADCPLL 708. In this manner, by using an internal reference PLL (such as the XOR based ADCPLL 708) as a clock signal for both the ADC and the MIPI interface, there is no longer any constraint imposed on PCB routing. Furthermore, this example implementation may ensure that any ADC clock jitter performance is satisfied, due to the synchronicity of the clock signal within and between the master device and slave device(s). In addition, this example implementation may ensure synchronicity of the RFS signal within the master device and slave device(s) in some examples, with an RFS signal embedded within a system clock.

In addition, this example implementation may also reduce any timing skew of the MIPI interface as the skew is linked to the clock duty cycle. If a MIPI interface is used and is needed to run at a faster clock (say, 480 MHz) than the ADC clock (240 MHz), it cannot be achieved by routing the clock signal to a single master device and, say, three slave devices in a PCB to provide a single 480 MHz signal to all dies with an accurate duty cycle (<+1-2%), which is needed for each MIPI interface (although not needed for each of the ADCs). Hence, in contrast, examples of the invention propose routing internally a 960 MHz clock signal 704, and dividing this high clock signal (e.g. by a factor of '2') internally, individually on each master and slave device to guarantee a good duty cycle at the output.

In some examples, as will be appreciated by a skilled person, the device(s) may be generic devices that are individually configurable as either a master device 710 or a slave device 720, 723, whereby a number of circuits or components or functionality is disabled. For example, in such a slave device 720, 723, since the clock and RFS_synch signal as well as LO signals are received from the master device 710, a slave crystal oscillator, slave main PLL and the slave MS_CLK transmit circuits are disabled. Many other blocks may be present inside the slave device, but are not mentioned herein to avoid obfuscating concepts of the invention. Furthermore, to illustrate the different approaches adopted by the master device(s) 710 and slave device(s) 720, 723 from a generic device in the example block diagram of FIG. 7, the respective signal paths that are disabled in each of the master device(s) 710 and slave device(s) 720, 723 are indicated as dashed lines, whereas the respective signal paths that are enabled in each of the master device(s) 710 and slave device(s) 720, 723 are indicated as solid lines.

In some examples, the distributed MS_CLK signal 784 may include a modulated, embedded master-slave clock signal, such as modulated embedded master-slave clock signal 384 from FIG. 3. In this context, the master device 710 further includes a digital circuit 716 configured to receive a RFS signal from MCU 214 via RFS pin 701, as well as an RFS_in signal 612. Thus, in some examples of the invention, it is envisaged that the frame start (e.g. RFS_start) process may commence in the master device 710 following, say, a SPI command (sent by the controller 214) or via a dedicated RFS pin 701 that is triggered by the controller 214 to directly start the ramp in the master device 710. The RFS signal is re-sampled in the digital circuit 716 of the master device using the demodulated received 240M_adcout clock 745. The re-sampled RFS signal is a RFS_out signal 780 for embedding into the MS clock signal within (and by) RFS modulator 762.

In other examples, it is envisaged that the MS_CLK signal 784 may only represent the master-slave clock signal (i.e. without an embedded RFS signal) for distribution amongst master device(s) 710 and slave device(s) 720.

In the embedded RFS_signal example, the master-slave distribution and synchronization circuit 760 is configured to embed a frame start signal, such as a chirp start (RFS_in) signal in a radar unit, into a ADCPLL output signal 782, referred to above as a "first clock signal," received from XOR based ADCPLL 708. Embedding the chirp start (RFS_in) signal 612 into the ADCPLL output signal 782 allows the two signals to be distributed across all master device(s) and slave devices with inherent synchronization and no delay between devices. In this example, the result of the embedding operation is a (modulated, distributed and received) master-slave clock signal 784. In this example, master-slave distribution and synchronization circuit 760 uses a RFS modulator 762 (implemented in, say, a LVDS transmit circuit) to embed the chirp start (RFS) signal 780 into the ADCPLL output signal 782.

In this example, each master-slave receiver circuit includes either a RFS and system clock demodulator circuit 765 in the master device(s) 710 or a RFS and system clock demodulator circuit 764 in the slave device(s) 720, 723 (implemented in, say, a LVDS receive circuit), configured to respectively de-embed (e.g. demodulate) the master-slave clock signal 784 into either a slave RFS_out signal 794 or a master-slave slave clock signal 790. Advantageously, in a slave device 720, the demodulated slave RFS_out signal 794 and demodulated master-slave slave clock signal 790 are synchronized between the master device(s) 710 and slave device(s) 720. Similarly, in the master device 710, a fed back (distributed and received modulated) master-slave clock signal 784 is also received and demodulated in RFS and system clock demodulator circuit 765 configured to respectively de-embed the master-slave clock signal 784 into a master RFS_out signal 731 and a master-slave slave clock signal 788. The master device 710 further includes one or more programmable bandpass filter(s) and one or more gain amplifiers (not shown), as well as one or several ADC(s) 741 that is/are coupled to a RFS and system clock demodulator circuit 765.

In this example, a sampling operation of received data is performed in the digital domain, inside respective digital controller 726 in the slave device 720 and inside digital controller 716 of the master device 710.

In response to, say, a serial-parallel interface (SPI) command coming from the MCU 214, the digital controller 716 of the master device 710 provides a chirp start signal (rfs_out) 780 that will be used by the master device 710 and slave devices 720, 723 and any other master device(s) of the radar unit 705. In this example, the RFS signal is provided to the master-slave clock distribution and synchronization circuit 760, and it is embedded on the ADCPLL output signal 782 by the RFS modulator 762. In this example, the RFS modulator 762 is an LVDS transmitter circuit that produces a modulated/embedded output LVDS signal. In one example, as illustrated, the RFS modulator 762 (and RFS and system clock demodulator circuit 765) of the master device 710 and RFS and system clock demodulator circuit 764 of the slave device(s) 720, 723 may be terminated by a 100 ohms differential resistor (T) 759, for example in order to reduce any reflections due to LVDS link asymmetry, which may corrupt the signal integrity and cause false zero crossings.

In accordance with examples of the invention, the slave device 720 is configured to demodulate and extract the chirp start (RFS) signal 794 from the differential master-slave clock synchronization signal with embedded RFS_in signal 784. In this example, slave device 720 uses an RFS and system clock demodulator circuit 764 implemented in LVDS.

The respective slave RFS and system clock demodulator circuit 764 is configured to extract respective slave clock signals (clk_rxS 788) in a CMOS format with very low delay variation between that clock and the master-slave system clock signal 790. In addition, the respective RFS demodulators 764, 765 are configured to demodulate the transmitted chirp start signal (rfs_in) in each respective device. The master-slave clock distribution and synchronization circuit 760 in the master device 710 generates the master-slave clock signal (MS-CLK) 784 and RFS and system clock demodulator circuit 765 and RFS and system clock demodulator circuit 764 are configured such that demodulate the respective received master-slave clock signal (MS-CLK) 784 such that they are very closely aligned.

A skilled artisan will appreciate that many other circuits, components and blocks may be present inside a master device 710 and slave device 720, but that these have been omitted purely for clarity purposes. In this manner, a system, such as a phased array radar system, employing example embodiments of the invention relating to a master-slave arrangement, may be able to benefit from improved clock synchronization accuracy in a multiple chip configuration.

In some examples, the master device 710 is configured to generate and distribute a master-slave clock 784 from a MS_clock LVDS transmit modulator 726 path to the MS_clock LVDS receive path inside slave devices via slave device LVDS RFS and system clock demodulator circuit 764, as well as back to master device LVDS receive demodulator 765. In this manner, in some examples, a clock signal with an embedded start of a frame indication may be used to sample the data inside different ADCs 741, 742 belonging to different ICs, in order to reduce phase error and consequently angle resolution at sensor level.

Also for example, in one embodiment, the illustrated examples of a master device 710 or slave device 720 may be implemented as circuitry located on a single integrated circuit 798, 799. Alternatively, the circuit and/or component examples may be implemented as any number of separate integrated circuits 798, 799 interconnected with each other in a suitable manner. The specifications and drawings are, accordingly, to be regarded in an illustrative rather than in a restrictive sense.

In this context, in some examples, each of the ADC clocks in the master device(s) and slave device(s) operate on an output of an LVDS demodulated MS_CLK, once passed through a duty cycle detector and corrector (DCC) 733. In some examples, a DCC 733 may be used to correct a bad duty cycle coming in via a LVDS link. However, such an approach does bring some limitations, in that it would be difficult to correct to +/−2% for a 480 MHz MIPI signal through this LVDS link, although correcting to achieve +/−5% on a 240 MHz link may be feasible in some examples, if needed, using current technologies.

Both RFSsynched signals 731, 732 and system clock (e.g. MS-CLK at 240 MHz) signals are used in the analog circuits of the ADCs 741, 742. In some examples, buffers 743, 744 may be inserted on the path for the RFS signal (rfs_out) 780 in order to compensate for any clock tree delay in the ADC module. The signals i.e. RFSin 612 and 240M_adcout 745, once balanced, are synchronous with each other.

RFS_in signal 612 and the ADC clock (e.g. a 240 MHz_adc_out) signal are used in the digital controller 716 to generate the filtered adcout_dig signal 702. The filtered adcout_dig signal 702 is transmitted through the MIPI interface 630 using a 960 MHz clock 704 obtained directly from the ADCPLL PLL 708, which guarantees a very good (e.g. to within a few ps) accuracy. In this manner, in some examples, the TSKEW MIPI alliance specification may be achieved.

Advantageously, in the architecture of FIG. 6, the LVDS demodulated MS_CLK 788, 790 is used as a system clock by ALL ADCs inside the various master and slave devices 710, 720, 723. In some examples, a 240 MHz clock (240M_adcpll_out) ADCPLL output signal 782 is the input of the master RFS and system clock modulator circuit 762. In this manner, after distribution to the various RFS and system clock demodulator circuits 764, 765, the ADC operation across each of the devices may be synchronized. Furthermore, in this manner, the distribution of the system clock to each reference PLL (which in the example of FIG. 6 is a XOR-based ADCPLL), benefits from a use of lower speed LVDS links. Furthermore, in examples of the invention, each receive RFS and system clock demodulator circuit 764, 765 is turned 'on' at each master device 710 and each of the (n) slave device(s), such that each device is configured to generate a synchronized LVDS demodulated MS_CLK system clock 788, 790.

In some examples, in this manner, an improved or optimal trade-off between synchronization accuracy and very fast data rates can be achieved. For example, it is possible to increase a speed of the MIPI 630, since the clock is generated internally with a good duty cycle, and not concurrently increase the clock speed for ADCs 741, 742. This opportunity and flexibility is particularly useful for high resolution radar systems, in that it provides a good trade-off between speed (e.g. data rate) and synchronicity.

In this example, the main PLL 717 that generates the MIPI clock is configured to use the Xtal oscillator 752 as a reference clock signal within the master device 710. Any unknown phase delay between the internal 240M_dig digital clocks (after clock tree insertion) and the MIPI interface clock may be managed through any suitable mechanism available inside MIPI interfaces. All those mechanisms guarantee that RFS and clocks are maintained synchronous from channel to channel and device to device.

The synchronization mechanism in the slave device 720 is also depicted in FIG. 6. The difference between the synchronization performed in the master device 710 and the synchronization performed in the slave device 720 is the generation of the MIPI clock in the slave device 720. In this example, although each of the master device 710 and slave device 720 comprise a respective ADCPLL 708, 709, the ADCPLL 708 in the master device is clocked by a 60 MHz signal 707 that is provided by the crystal (XCO) 752. Similarly, in the slave device(s) 720, 723, an ADCPLL 709 is provided but can be clocked by any crystal oscillator signal. Hence, a skilled artisan will appreciate that it is important to create a 60 MHz clock signal, for example one that is divided down in divider 792 in the slave device 720, 723, say from a 240 MHz clock signal 790 coming from a LVDS link from the master device 710, to run the slave ADCPLL. This is possible in this architecture, as the ADCPLL 709 in the slave device 720, 723 is not used to drive a Main PLL (it is 'OFF'). Thus, the ADCPLL 709 in the slave device 720, 723 that generates the MIPI clock shall use a divided version 793, from divider 792, of the demodulated 240 MHz clock (instead of a 60 MHz Xtal clock) as a reference for the slave devices. The RFS and ADC clocks in the slave device 720 use the same mechanism as in the master device 710 and share the same external modulated clock and RFS signal MS_CLK_240 MHz. Again, any phase mis-alignment between the ADC output and MIPI input may be handled by a well-known mechanism present inside MIPI components or circuits, such as FIFO, multi-phase programmability, etc.).

Thus, FIG. 6 illustrates a radar unit that includes a plurality of cascaded devices that include at least one master device 710 and at least one slave device 720, 723 configured in a master-slave arrangement. The at least one master device 710 and at least one slave device 720, 723 each includes an analog-to-digital converter, ADC, 741, 742 configured to use a same re-created system clock signal to align respective sampling instants between each ADC 741, 742. A radar receiver in the radio unit performs the sampling of the radar data, in response to a recovered RFS signal, within the receiver baseband circuit. The RFS signal is a signal provided by the MCU 214 in a case where the device is configured as a master device and provided by the master device in a case where the device is configured as a slave device. The synchronization between the RFS and the clocks must be ensured all along the receiver baseband path.

In examples of the invention, in contrast to the known teaching, synchronizing of the data and clock signals is performed both inside and outside of the master and slave design, so that the phase variation between the received digital output data paths at output pin(s) 640 of multiple devices always sample the analog received signal with a same phase from channel-to-channel and device-to-device, does not vary in PVT. This synchronization is achieved using high quality clocks. In this context, the synchronizing of the data and clock signals being performed outside of the master and slave design is achieved due to the symmetrical nature of the signal transmission paths in the PCB distribution, which may be in a star connection with equal length transmission lines to ensure no delay between signal arrival at multiple devices. In this context, the synchronizing of the data and clock signals being performed inside of the master and slave design is achieved due to the fact that when the de-embedded RFS and clock signals are passing through the ADCs, they are constrained to be synchronous by using the same clock tree on both signals, and to provide synchronous outputs 745, 612, up to digital controller 716, 726.

In examples of the invention, it is noteworthy that the RFSsynched signal 731, 732 and 240 MHz ADC clock 788, 790 entering the ADC(s) 741, 742 in respective master device 710 and slave device 720, are considered synchronous, as they are coming from the RFS and system clock demodulator circuits 764, 765. The RFS and system clock demodulator circuits 764, 765 are, by design, configured to have low PVT variations and provide those signals in a synchronous manner between themselves, using the synchronously de-embedded RFS signal.

In some examples, a systematic error between the synchronized data and clock signals, which can be due to process variations, for example, can be tolerated and may be compensated through a higher level phase calibration. After such process impact calibration, the MCU may be configured to add a dedicated systematic phase offset on each receiver channel at, say, the start-up of the respective master and slave devices, whose value may be found during a calibration process to align all phases of all signals (e.g. intermediate frequency (IF) signals) coming from all receivers. For optimal operation of distributed radar systems, it is important that the signals (such as LO 140, MS clock signal 142 and RFS 166 from FIG. 1) are synchronous across all receiver circuits on different devices. This means that, after calibration of the phase difference between all receiver channels in all master and slave devices, the voltage supply Vcc, temperature and aging variation between all devices distributed within the PCB should not change the initial clock alignment, for example after a one-time calibration operation is performed at radar module level.

The above circuits and operations aim to improve or guarantee that RFS and clocks are maintained synchronous from channel to channel and device to device.

Referring now to FIG. 7, and with reference to the example architecture 600 of FIG. 6, an example flowchart 700 of the steps associated with a radar clock and data synchronization across multiple master device(s)-slave device(s) is illustrated, according to example embodiments of the invention. The flowchart starts at 802, with a start-up of at least the master device (e.g. master device 710 of FIG. 6). At 804, the main frequency/clock resonator, e.g. XCO 752 from FIG. 6, provides a reference 60 MHz clock to a master ADPLL 708, as well as to master digital controller 716. At 806, the master ADPLL 708 starts and provides a high speed clock 704 to the master MIPI 630. At the same time, the master ADPLL 708 provides, say, a 240 MHz clock signal, ADCPLL output signal 782, to the master-slave clock distribution and synchronization circuit 760, as well as, say, a reference 120 MHz clock for the main PLL 717.

At 808, the transmitted master-slave clock signal (MS-CLK) 784 is distributed outside the master device 710 and is star-routed on the PCB to reach various master device and slave device RFS and system clock demodulator circuits 764, 765. Reception of this master-slave clock signal (MS-CLK) 784 enables all slave devices 720, 723 to be able to start. Once the RFS_signal has been de-embedded from the distributed master-slave clock signal (MS-CLK) 784, the re-created 240 MHz clock signals 788, 790 are then utilised by the respective master device and slave device ADCs 741 742. In each slave device 720, 723, the re-created 240 MHz clock signals 788, 790 is divided in slave devices (via divider 792) in order to create the 60 MHz slave clock reference 793 (which is used for the digital controller 726 and for the ADCPLL 709) to enable the slave device(s) 720, 723 to start. At this point, a 960 MHz MIPI clock of the slave device 720, 723 is then made available after ADCPLL 709 to the slave device(s) 720, 723.

In one example at 810, a main PLL is initiated and a waveform generator of the master device 710 controls its VCO to output a LO signal with a frequency that is proportional to a chirp start frequency, $f_{start\_master}$. In one example application, one or more slave device(s) 720, 723 are initiated to receive the signal from the master device 710, and accordingly receive their LO frequency (noting that the main PLL in all slave devices 720, 723 is turned 'off' and therefore with careful PCB star-routing the same LO signal coming from the master device may be used to achieve phase coherence across all slave devices).

In examples of the invention, at 810, a master device 710 also starts a FMCW ramp signal and embeds a RFS_in signal within a MS clock signal and distributes the master-slave clock signal (MS-CLK) 784 is then sent to all other master device(s) and slave device(s) 720, 723. At 810, the distributed master-slave clock signal (MS-CLK) 784 with an embedded RFS_in signal is received and the RFS 731, 732 is demodulated in each of the master device(s) and slave device(s), 732, 731 and the clock signal 788, 790 re-created.

At 812, the re-created clock signals 788, 790 and the demodulated RFS_signals are provided to respective ADCs 741, 742. The respective ADCs 741, 742, each output a signal indicating that the ramp has started (e.g. an RFSin signal 612) in each device in a synchronous manner, which is provided to the digital controllers 716, 726 on each master device 710 and slave device(s) 720, 723.

At 814, each of the master device(s) 710 and slave device(s) 720, 723 receive a representation of an echo signal and send validated, demodulated data to the controller 214, say, via the MIPI interface 630 (where the pins are not shown here for simplicity purposes only) based on the synchronised clock signal.

In this manner, synchronization between the master device(s) 710 and slave device(s) 720, 723 may be achieved, after which, all the master device(s) 710 and slave device(s) 720, 723 have the same frequency chirp start and chirp end frequencies, as well as the same sampling clock. The data sampled by all of the devices (or ICs) including the ADC are then substantially synchronous. The flowchart ends at 816.

In some instances, the inventors have recognised and appreciated that the duty cycle of the external clock of FIG. 6 or FIG. 7 may be corrupted should the PCB routing be non-symmetrical, which may in turn degrade the clock quality and thus the Radar system performances. In response thereto, the inventors propose below an architecture that may alleviate this potential problem. In some examples, the architecture proposed in FIG. 8 offers the benefit of keeping the system phase noise very low, since the phase noise contribution of a reference PLL (which is a charge pump-based PLL in this example, compared to the ADCPLL in FIG. 6) may be neglected. This is possible because in this solution of FIG. 8, the main PLL 917 may be driven by the clock signal coming directly from the crystal oscillator XCO 952 at, say, 120 MHz, and not from a reference PLL (e.g. an ADCPLL, or charge pump-based PLL) placed in between. In this example, the clock signal is generated from the more accurate crystal oscillator 952, which has the best noise performance (basically the phase noise of the crystal oscillator 952, which is very low if correctly designed.

Figure 8:
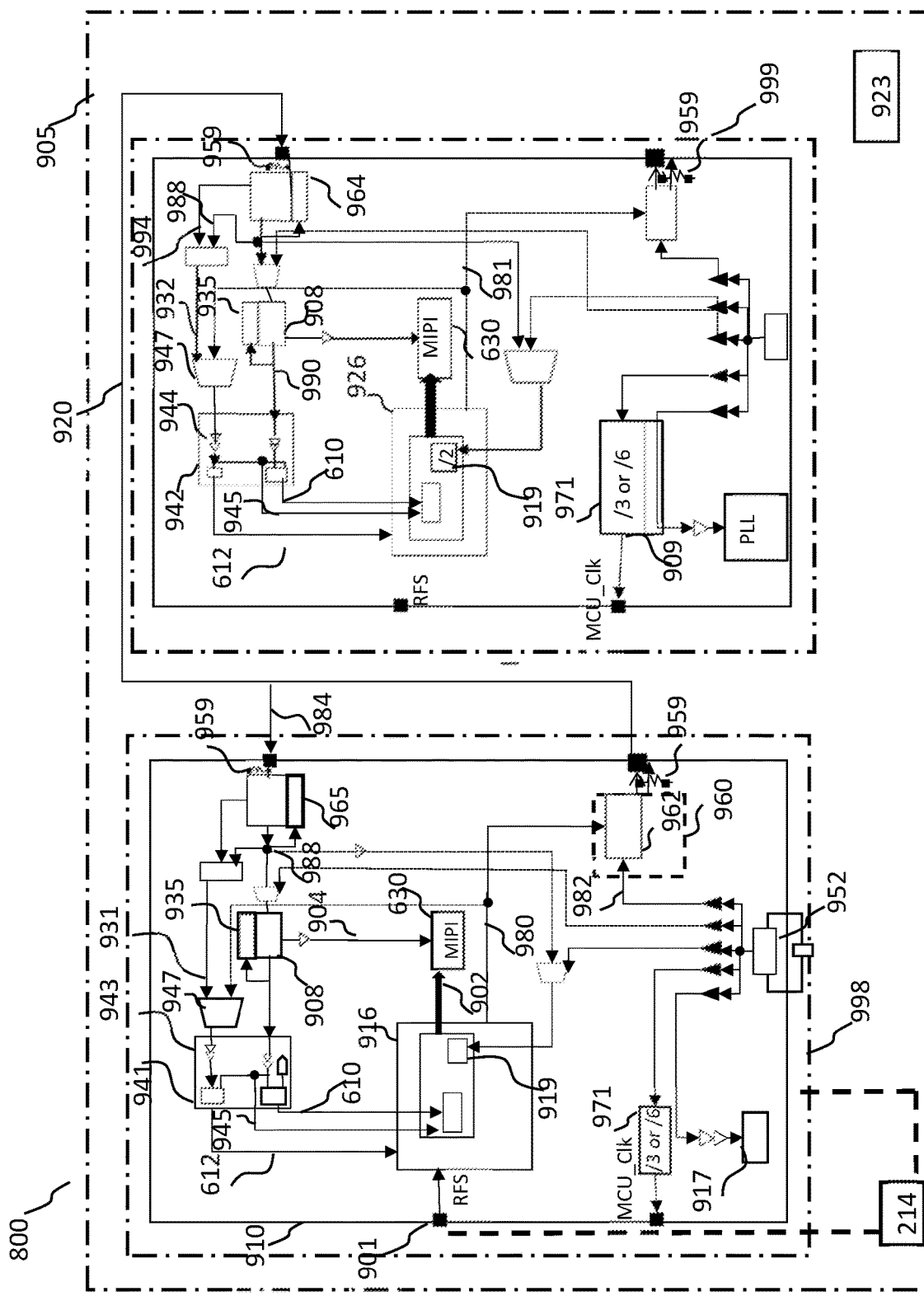
FIG. 8 illustrates an example block diagram of a master device-slave device arrangement configured to provide a radar clock and data synchronization, whereby potential duty cycle problems that may degrade the clock quality (and thus radar system performance) may be removed, according to some examples of the invention.

Referring now to FIG. 8, an example block diagram 800 of a master device-slave device arrangement configured to provide a system clock and data synchronization is illustrated, according to some examples of the invention. In this example, the master-slave architecture is illustrated as a radar unit 905 that includes a master device 910 and one or multiple slave devices 920, 923. One slave device 920 is shown for clarity purposes only, with the potential for other similar slave devices shown as 923. In this example, the master device 910 incorporates a frequency generation circuit, which in this example includes a 120 MHz high-purity Xtal oscillator 952. In this example, a master-slave clock signal 982 is routed from the 120 MHz high-purity Xtal oscillator 952 and in some instances is widely used within the master device 910, including an input to main PLL 917, as well as, via a dividing circuit 971 to an MCU output clock port. In some examples, the dividing circuit 971 divides the 120 MHz high-purity Xtal oscillator master-slave clock signal 982 to a 40 MHz or 20 MHz signal. The 120 MHz high-purity Xtal oscillator 952 also provides a 120 MHz clock master-slave clock signal 982 to the digital circuit 916, and in this example a divide-by-two circuit 919 contained in the digital circuit 916, configured to provide a 60 MHz clock signal to a MIPI interface 630. In this example, the 120 MHz high-purity Xtal oscillator master-slave clock signal 982 is also provided to a frequency-phase detector and charge pump (CP) ADCPLL 908. In this manner, an internal ADCPLL uses a phase-frequency detector and a charge pump that is configured to generate (internally) an ADC clock with an expected or desired duty cycle and jitter performance for the ADC 941, and the high-speed receiver output data interface clock, such as MIPI interface clock 904, whilst maintaining a constant phase relationship between all of the output clocks and input clocks within or coming from the master device 910.

The inventors have recognised that the serial MIPI interface needs a very fast clock (e.g. of an order of 960 MHz in this example), in order to support increasing data rate and throughput. Thus, in examples of the invention, the inventors propose to achieve a very fast clock for the MIPI interface by using the very fast 960 MHz clock 904 provided by the CP ADCPLL 908. In this manner, by using an internal reference PLL (such as the CP ADCPLL 908) as a clock signal for both the ADC 931 and the MIPI interface 630, there is no longer any constraint imposed on PCB routing. Thus, in the example circuit of FIG. 8, the 120 MHz clock signal is also the reference for the charge pump-based PLLs (for example applied via external symmetrical connections, through LVDS transmitter circuit in a master device 910 and LVDS receiver circuits in both master device(s) 910 and in slave device(s) 920, 923. In this example circuit of FIG. 8, a charge pump-based PLL is preferable as they have equal phase_IN=phase_OUT, characteristics. Hence, with a 120 MHz clock signal that is received symmetrical on each master device(s) 910 and each slave device(s) 920, 923, it is possible to guarantee that clocks 240 MHz_adcin_clk 990, 908 are in phase. In this manner, the ADCs 941, 942 will be synchronous in each master device(s) 910 and each slave device(s) 920, 923. Also, in some examples, having an external link LVDS to distribute the 120 MHz, it is possible to relax the PCB constraints. In this example, the 120 MHz high-purity Xtal oscillator master-slave clock signal 982 is also provided to a master-slave clock distribution and synchronization circuit 960, which includes a RFS modulator 962.

Furthermore, this example implementation may ensure that any ADC clock jitter performance is satisfied, due to the synchronicity of the clock signal within and between the master device and slave device(s). In addition, this example implementation may ensure synchronicity of the RFS signal within the master device and slave device(s) in some examples, with an RFS signal embedded within a system clock. In addition, this example implementation may also reduce any timing skew of the MIPI interface, as described previously.

In some examples, as will be appreciated by a skilled person, the device(s) may be generic devices that are individually configurable as either a master device 910 or a slave device 920, 923, whereby a number of circuits or components or functionality is disabled. In this context, some of the paths highlighted in dashed line within the master device or slave device in FIG. 8 has been disabled, with the solid lines enabled communication paths. For example, in such a slave device 920, 923, since the clock and RFS_synch signal as well as LO signals are received from the master device 910, a slave crystal oscillator, main PLL and the RFS modulator of a MS clock distribution and synchronization circuit are disabled. Many other blocks may be present inside the slave device, but are not mentioned herein to avoid obfuscating concepts of the invention. Furthermore, in this example, an RFSout path 981 in the slave device 920 is dashed, because, in normal operation in accordance with examples of the invention, the signal is created from the RFS demodulated output 994 from the master device 910 and demodulated in RFS and system clock demodulator circuit 964. In some instances, there may be eventually a use case when the RFS_out signal 980, 981 could be activated in both master and slave devices (with the re-created RFS signal 931, 932 that is input to respective multiplexers 947, and this in scenarios when the RFSout signal may not be embedded in the master-slave clock signal, and thus provided by the external RFS pin 901 from MCU 214. This is only possible if the MCU 214 is synchronized to the master device 910 (which is the case here, via MCU_CLK), but it may impose a constraint on timing of MCU_CLK and RFS pads (delay variation over PVT) on both MCU 214 and master device 910 and slave device(s) 920, 923.

In the embedded RFS_signal example, the master-slave distribution and synchronization circuit 960 is configured to embed a frame start signal, such as a chirp start (RFS_in) signal in a radar unit, into a master-slave clock signal 982 received from the 120 MHz high-purity Xtal oscillator 952. Embedding the chirp start (RFS_in) signal 980 from the digital controller 916 into the master-slave clock signal 982 allows the two signals to be distributed across all master device(s) and slave devices with inherent synchronization and no delay between devices. In some examples, the chirp start (RFS_in) signal 980 may be provided from an SPI command sent by the MCU 214 to the digital controller 916 via the RFS pin 901 or using the master device modulator to embed the RFS signal in the master-slave clock for distribution to other devices. In this example, the result of the embedding operation is a (modulated, distributed and received) master-slave clock signal 984. In this example, master-slave distribution and synchronization circuit 960 uses a RFS modulator 962 (implemented in, say, a LVDS transmit circuit) to embed the chirp start (RFS) signal 980 into the master-slave clock signal 982 received from the 120 MHz high-purity Xtal oscillator 952.

In this example, each master-slave receiver circuit includes either a RFS and system clock demodulator circuit 965 in the master device(s) 910 or a RFS and system clock demodulator circuit 964 in the slave device(s) 920, 923 (implemented in, say, a LVDS receive circuit), configured to respectively de-embed (e.g. demodulate) the master-slave clock signal 984 into either a slave RFS_out signal 994 or a master-slave slave clock signal 990. Advantageously, in a slave device 920, the demodulated slave RFS_out signal 994 and demodulated master-slave slave clock signal 990 are synchronized between the master device(s) 910 and slave device(s) 920, 923. Similarly, in the master device 910, a fed back (distributed and received modulated) master-slave clock signal 984 is also received and demodulated in RFS and system clock demodulator circuit 965 configured to respectively de-embed the master-slave clock signal 984 into a master RFS_out signal 931 and a master-slave slave clock signal 988. The master device 910 further includes one or more programmable bandpass filter(s) and one or more gain amplifiers (not shown), as well as one or several ADC(s) 941 that is/are coupled to a RFS and system clock demodulator circuit 965.

In this example, a sampling operation of received data is performed in the digital domain, inside respective digital controller 926 in the slave device 920 and inside digital controller 916 of the master device 910.

In some examples, as illustrated, the RFS modulator 962 (and RFS and system clock demodulator circuit 965) of the master device 910 and RFS and system clock demodulator circuit 964 of the slave device(s) 920, 923 may be terminated by a 100 ohms differential resistor (T) 959, for example in order to reduce any reflections due to LVDS link asymmetry, which may corrupt the signal integrity and cause false zero crossings.

In accordance with examples of the invention, the slave device 920 is configured to demodulate and extract the chirp start (RFS) signal 994 from the differential master-slave clock synchronization signal with embedded RFS_in signal 984. In this example, slave device 920 uses an RFS and system clock demodulator circuit 964 implemented in LVDS.

The respective slave RFS and system clock demodulator circuit 964 is configured to extract respective slave clock signals 988 in a CMOS format with very low delay variation between that clock and the master-slave system clock signal 990. In addition, the respective RFS demodulators 964, 965 are configured to demodulate the transmitted chirp start signal (rfs_demodulated signal 994) in each respective device. The respective modulator 960 in the master device 910 generates the master-slave clock signal (MS-CLK) 984 and the RFS and system clock demodulator circuit 965 and RFS and system clock demodulator circuit 964 are each configured such that they demodulate the respective received master-slave clock signal (MS-CLK) 984 such that they are very closely aligned.

A skilled artisan will appreciate that many other circuits, components and blocks may be present inside a master device 910 and slave device 920, but that these have been omitted purely for clarity purposes. In this manner, a system, such as a phased array radar system, employing example embodiments of the invention relating to a master-slave arrangement, may be able to benefit from improved clock synchronization accuracy in a multiple chip configuration.

In some examples, the master device 910 is configured to generate and distribute a master-slave clock 984 from a MS_clock LVDS transmit modulator path to the MS_clock LVDS receive path inside slave devices, via slave device LVDS RFS and system clock demodulator circuit 964, as well as back to master device LVDS receive demodulator circuit 965. In this manner, in some examples, a clock signal with an embedded start of a frame indication may be used to sample the data inside different ADCs 941, 942 belonging to different ICs, in order to reduce phase error and consequently angle resolution at sensor level.

Also for example, in one embodiment, the illustrated examples of a master device 910 or slave device 920 may be implemented as circuitry located on a single integrated circuit 998, 999. Alternatively, the circuit and/or component examples may be implemented as any number of separate integrated circuits 998, 999 interconnected with each other in a suitable manner. The specifications and drawings are, accordingly, to be regarded in an illustrative rather than in a restrictive sense.

In some examples, a clock detector circuit 935 is attached to the CP ADCPLL 908, for example for safety purposes and in order to detect whether the duty cycle is within a given range. The clock detector circuit 935 is coupled to the RFS and system clock demodulator circuit 964, 965 in order to detect whether the master-slave clock signal 984 coming from the LVDS link is below a safe level.

Both RFSsynched signals 931, 932 and system clock (e.g. MS-CLK at 240 MHz) signals are used in the analog circuits of the ADCs 941, 942. In some examples, buffers 943, 944 may be inserted on the path for the RFS signal (rfs_out) 980 in order to compensate for any clock tree delay in the ADC module. The signals i.e. RFSin 612 and 240M_adcout 945, once balanced, are synchronous with each other.

RFS_in signal 612 and the ADC clock (e.g. a 240 MHz_adc_out) signal are used in the digital controller 916 to generate the filtered adcout_dig signal 902. The filtered adcout_dig signal 902 is transmitted through the MIPI interface 630 using a 960 MHz clock 904 obtained directly from the main PLL 917, which guarantees a very good (e.g. to within a few psec.) accuracy. In this manner, in some examples, the TSKEW MIPI alliance specification may be achieved.

Advantageously, in the architecture of FIG. 8, the LVDS demodulated MS_CLK 988, 990 is used as a system clock by ALL ADCs inside the various master device(s) 910 and slave devices 920, 923. In some examples, a 240 MHz clock (240M_adcpll_out) 982 is generated within the master device 910, in a phase-frequency detector and charge pump-based PLL (e.g. the CP ADCPLL 908) referenced to a 60 MHz high-purity crystal source 952. This clock signal 982 is the input of the master RFS and system clock modulator circuit 962. In this manner, after distribution to the various RFS and system clock demodulator circuits 964, 965, the ADC operation across each of the devices may be synchronized. Furthermore, in this manner, the distribution of the system clock to each reference PLL (which in the example of FIG. 8 is a CP ADCPLL), benefits from a use of lower speed LVDS links. Furthermore, in examples of the invention, each receive RFS and system clock demodulator circuit 964, 965 is turned 'on' at each master device 910 and each of the (n) slave device(s), such that each device is configured to generate a synchronized LVDS demodulated MS_CLK system clock 988, 990.

The synchronization in the slave device 920 is also depicted in FIG. 9. The RFS and ADC clocks in the slave device 920 use the same mechanism as in the master device 910 and share the same external modulated clock and RFS signal MS_CLK_240 MHz. The above circuits and operations aim to improve or guarantee that RFS and clocks are maintained synchronous from channel to channel and device to device.

Thus, the example block diagram 800 of a master device-slave device arrangement utilises a lower speed LVDS link to distribute reference clock to each reference PLL (CPADCPLL). In this manner, the reference PLLs (e.g. CP ADCPLLs 908) are turned 'on' at each master device 910 and each of the slave device(s) 920, 923 (or ICs). In this example, each CP ADCPLL provide the ADCs 941, 942 a respective synchronized clock signal, since all ADC clock signals are synchronous due to a use of a charge pump type PLL.

In this example, the serial MIPI 630 is provided with a very fast clock (e.g. 960 MHz) by CP ADCPLL on each master device 910 and each of the slave device(s) 920, 923 (or ICs) to allow increased data rate and throughput.

Furthermore, the concept of providing the ADC and MIPI clocks using an internal reference PLL, such as CP ADCPLLs 908, there is no requirement to constrain internal PCB routing of the clock signals. This may ensure that ADC clock jitter performance is met, and also may allow a reducing of skew of MIPI 630. In this manner, an improved or optimal trade-off between the synchronization accuracy, and very fast data rates required for high resolution radar system can be achieved.

In addition, the example block diagram 800 of a master device-slave device arrangement enables a decorrelation between LVDS link speed and maximum clock frequency allowed for use in the ADC 941, 942 and MIPI 630. For example, in some examples, a master-slave system clock frequency (for example external to the PCB) that is distributed with a frequency that is lower than the clock frequency required by the ADCs 941, 942 (linked to sampling rate), and by the MIPI 630 (linked to the data throughput).

Referring now to FIG. 9, and with reference to the example architecture 800 of FIG. 8, an example flowchart 900 of the steps associated with a radar clock and data synchronization across multiple master device(s)-slave device(s) is illustrated, according to some example embodiments of the invention. In particular, the flowchart 900 may address potential duty cycle problems that may degrade the clock quality (and thus radar system performance), which examples of the invention may remove, as described below. The example flowchart 900 starts at 1002, with a start-up of at least the master device (e.g. master device 910 of FIG. 8). At 1004, the crystal oscillator 952 (which is used as the main frequency/clock resonator) provides a reference clock 982 to the master device 910 and slave device(s) 920, 923. In this example the reference clock 982 is a master-slave clock signal running at 120 MHz (MS_CLK_120 MHz). At 1004, the crystal oscillator 952 also provides the reference clock, to controller 214 as MCU CLK as well as master digital controller 916. In some examples, at 1004, a further clock signal is also sent to master device(s) 910 and slave device(s) 920, 923.

At 1006, the master CP PLL 908 starts and provides the 120 MHz reference clock 982 to the master MIPI 630. At the same time, the crystal oscillator 952 provides, say, a 120 MHz clock signal 982 to the master-slave clock distribution and synchronization circuit 960, as well as, say, a reference 120 MHz clock for the main PLL 917 and a MCU clock to the controller 214 via one or more dividing circuits 971.

At 1008, the embedded RFS master-slave clock signal (MS-CLK) 984 is distributed outside the master device 910 and is star-routed on the PCB to reach various master device and slave device RFS and system clock demodulator circuits 964, 965. Once the RFS_signal has been de-embedded from the distributed master-slave clock signal (MS-CLK) 984, the re-created 120 MHz clock signals 988, 990 are then provided to the CP ADCPLL 908 of both master device 910 and slave device(s) 920, 923 and to the digital controller 926 of the slave device(s) 920, 923 only. The clock signal output from the CP ADCPLL 908 of both master device 910 and slave device(s) 920, 923, together with the de-embedded RFS_signal are utilised by the respective master device and slave device ADCs 941, 942. Reception of this master-slave clock signal (MS-CLK) 984 enables all slave devices 920, 923 to be able to start, and in this example the digital controller 926, CP ADCPLL 908, ADCs 942 etc. of the slave device(s) 920, 923, as well as some circuits inside the master device 910, such as the CP ADCPLL 908, ADC(s) 941, etc.

In one example at 1010, a main PLL is initiated and a waveform generator of a master device controls its oscillator in order to output a LO signal with a frequency that is proportional to a chirp start frequency, $f_{start\_master}$. In one example application, one or more slave device(s) are initiated to receive the signal from the master device 910, and accordingly receive their LO frequency (at a same frequency with careful PCB star routing needed for phase coherence).

In examples of the invention, also at 1010, a master device 910 starts a FMCW ramp signal and embeds a RFS_in signal within a master-slave clock signal. In some examples, the master-slave clock signal is then sent to all other master device(s) 910 and slave device(s) 920, 923. At 1010, the master-slave clock signal with an embedded RFS_in signal is received and demodulated in each of the master device(s) and slave device(s). At 1012, the ramp (chirp) signal starts in each of the master device(s) 910 and slave device(s) 920, 923.

At 1014, each of the master device(s) 910 and slave device(s) 920, 923 receive a representation of an echo signal and send validated, demodulated data to the MCU 214 via the MIPI interface 630 based on the synchronised clock signal with an embedded RFS_in signal. In this manner, synchronization between the master device(s) 910 and slave device(s) 920, 923 is achieved, after which, all the master device(s) 910 and slave device(s) 920, 923 have the same frequency chirp start and chirp end frequencies, as well as the same sampling clock. The data sampled by all of the devices (or ICs) including the ADC is now substantially synchronous. The flowchart ends at 1016.

Although examples of the invention are described with reference to a radar unit suitable for an automotive application, it is envisaged that the concepts herein described may be applicable to other applications, such as radar for robotics or drones.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or integrated circuit devices. Accordingly, unless implied or stated otherwise, the connections may for example be direct connections or indirect connections. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radar unit comprising:
a plurality of cascaded devices that comprise at least one master device and at least one slave device configured in a master-slave arrangement, wherein the at least one slave device and the at least one master device are connected through transmission lines, and wherein the at least one master device and at least one slave device each include:
a demodulator circuit configured to receive a distributed reference clock signal that includes a system clock signal and a chirp start signal embedded in the system clock signal, and to produce a re-created system clock signal and a reproduced chirp start signal from the distributed reference clock signal;
a clock generation circuit comprising an internally-generated reference phase locked loop configured to receive the re-created system clock signal, and to create a master-slave clock signal based on the re-created system clock signal; and
an analog-to-digital converter, ADC, coupled to the reference phase locked loop and configured to use the master-slave clock signal and the reproduced chirp start signal to align respective sampling instants of a received representation of an echo signal, resulting from a transmitted frequency modulated signal, between each ADC of the at least one master device and at least one slave device.

2. The radar unit of claim 1 wherein the distributed reference clock signal is received over a low voltage differential signalling, LVDS, link.

3. The radar unit of claim 1 wherein the internally-generated reference phase locked loop is an internally-generated reference charge pump analog-to-digital converter phase locked loop, CPADCPLL, that is turned on in each of the at least one master device and at least one slave device.

4. The radar unit of claim 3 wherein the internally-generated reference CPADCPLL is configured to provide an ADC clock signal to the ADCs that is higher than the received distributed clock signal and that includes respective time-aligned sampling instants between each ADC of each of the at least one master device and at least one slave device.

5. The radar unit of claim 1, wherein at least one of the at least one master device and at least one slave device further comprises:
 a digital controller coupled to the demodulator circuit and configured to re-sample the re-created system clock signal.

6. The radar unit of claim 1, wherein the demodulator circuit is configured to receive the distributed reference clock signal that includes the chirp start signal, and to de-embed the chirp start signal from the distributed reference clock signal to produce the re-created system clock signal.

7. The radar unit of claim 3, wherein the clock generation circuit is operably coupled to a Mobile Industry Processor Interface, MIPI, and the internally-generated reference CPADCPLL is configured to provide a clock signal to the MIPI in each of the at least one master device and at least one slave device that has a higher frequency than the distributed reference clock signal.

8. The radar unit of claim 1, wherein the demodulator circuit is terminated by a differential resistor.

9. A method for clock distribution and synchronization in a radar unit having at least one master device and at least one slave device configured in a master-slave arrangement, wherein the at least one slave device and the at least one master device are connected through transmission lines, wherein the method includes, at each of the at least one master device and at least one slave device, performing steps of:
 receiving a distributed reference clock signal, wherein the distributed reference clock signal includes a system clock signal modulated with a chirp start signal;
 producing a re-created system clock signal and a reproduced chirp start signal from the distributed reference clock signal;
 receiving the re-created system clock signal at an internally-generated reference phase locked loop, and creating a master-slave clock signal based on the re-created system clock signal; and
 using the re-created master-slave clock signal and the reproduced chirp start signal at an analog-to-digital converter, ADC, to align respective sampling instants of a received representation of an echo signal, resulting from a transmitted frequency modulated signal, between each ADC of the at least one master device and at least one slave device.

10. The radar unit of claim 1, wherein lengths of connections between each of the at least one slave device and the at least one master device are equal.

11. The radar unit of claim 1, wherein the at least one slave device and the at least one master device are coupled to a star routed printed circuit board.

12. The method for clock distribution and synchronization of claim 9, wherein lengths of connections between each of the at least one slave device and the at least one master device are equal.

13. The method for clock distribution and synchronization of claim 9, wherein the at least one slave device and the at least one master device are star routed.

14. The radar unit of claim 1, wherein:
 the at least one master device is configured to embed the chirp start signal in the system clock signal using amplitude modulation; and
 the demodulator circuit is configured to produce the reproduced chirp start signal from the distributed master-slave clock signal using amplitude demodulation.

15. The radar unit of claim 1, wherein the transmitted frequency modulated signal is a frequency-modulated continuous wave (FMCW) radar signal.

16. A radar unit comprising:
 a master device configured to
  transmit a chirp signal based on a chirp start signal,
  produce a modulated embedded master-slave clock signal that includes a system clock signal modulated by the chirp start signal,
  distribute the modulated embedded master-slave clock signal, as a distributed system clock signal, to the master device and to a slave device,
  receive the distributed system clock signal,
  produce a re-created system clock signal and a reproduced chirp start signal from the distributed system clock signal,
  receive a first echo signal resulting from the transmitted chirp signal, and
  sample a representation of the first echo signal, wherein sampling instants of the representation of the first echo signal are aligned based on the re-created system clock signal and the reproduced chirp start signal; and
 the slave device coupled to the master device in a master-slave arrangement, wherein the slave device is configured to
  receive the distributed system clock signal,
  produce the re-created system clock signal and the reproduced chirp start signal from the distributed system clock signal,
  receive a second echo signal resulting from the transmitted chirp signal, and
  sample a representation of the second echo signal, wherein sampling instants of the representation of the second echo signal are aligned based on the re-created system clock signal and the reproduced chirp start signal.

17. The radar unit of claim 16, wherein the chirp signal is a frequency-modulated continuous wave (FMCW) radar signal.

18. The radar unit of claim 16, wherein the master device and the slave device are coupled to a star routed printed circuit board.

* * * * *